(12) United States Patent
Tokiwa et al.

(10) Patent No.: US 8,339,833 B2
(45) Date of Patent: Dec. 25, 2012

(54) ELECTRICALLY REWRITABLE NONVOLATILE SEMICONDUCTOR STORAGE DEVICE INCLUDING A VARIABLE RESISTIVE ELEMENT

(75) Inventors: Naoya Tokiwa, Fujisawa (JP); Hiroshi Maejima, Chuo-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 399 days.

(21) Appl. No.: 12/708,822

(22) Filed: Feb. 19, 2010

(65) Prior Publication Data

US 2010/0238706 A1 Sep. 23, 2010

(30) Foreign Application Priority Data

Mar. 23, 2009 (JP) ................................. 2009-070862

(51) Int. Cl.
*G11C 11/00* (2006.01)
(52) U.S. Cl. .............. 365/148; 365/185.09; 365/185.17; 365/230.03; 365/185.22
(58) Field of Classification Search ............. 365/185.22, 365/185.09, 185.17, 230.03, 148
See application file for complete search history.

(56) References Cited

U.S. PATENT DOCUMENTS

| | | | | |
|---|---|---|---|---|
| 6,859,401 B2 * | 2/2005 | Ikehashi et al. | .......... | 365/189.05 |
| 7,355,892 B2 * | 4/2008 | Hemink | .................... | 365/185.22 |
| 7,796,440 B2 * | 9/2010 | Lee | ........................... | 365/185.22 |
| 8,116,134 B2 * | 2/2012 | Shibata et al. | ........... | 365/185.09 |
| 2008/0258129 A1 | 10/2008 | Toda | | |
| 2009/0230435 A1 | 9/2009 | Maejima | | |

FOREIGN PATENT DOCUMENTS

| | | |
|---|---|---|
| JP | 5-89687 | 4/1993 |
| JP | 2001-84777 | 3/2001 |
| JP | 2002-279789 | 9/2002 |
| JP | 2004-22112 | 1/2004 |
| JP | 2004-95029 | 3/2004 |
| JP | 2006-79756 | 3/2006 |
| JP | 2007-188552 | 7/2007 |
| JP | 2008-300011 | 12/2008 |
| KR | 10-2008-0114386 | 12/2008 |

OTHER PUBLICATIONS

Mark Johnson, et al., "512-Mb PROM With a Three-Dimensional Array of Diode/Antifuse Memory Cells", IEEE Journal of Solid-State Circuits, vol. 38, No. 11, Nov. 2003, 5 pages.
Japanese Decision of Refusal issued Jan. 31, 2012 in patent application No. 2009-070862 with English translation.
Korean Office Action issued Jul. 13, 2011, in Patent Application No. 10-2010-0019734 (with English-language translation).
Office Action issued Jul. 19, 2011, in Japanese Patent Application No. 2009-070862 (with English-language translation).
U.S. Appl. No. 13/428,089, filed Mar. 23, 2012, Tokiwa.

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A nonvolatile semiconductor storage device includes a memory core that includes plural banks, the bank including plural memory cells and a data write circuit that supplies a bias voltage to the memory cell, the memory core being logically divided into plural pages, the page including a predetermined number of memory cells belonging to a predetermined number of banks; and a control circuit that controls the data write circuit to perform page write in each write unit including a predetermined number of memory cells, pieces of data being written in the page in the page write, the control circuit performing the page write by repeating a step including a program operation and a verify operation, the control circuit performing the program operation and the verify operation in a next step or later only to the write unit in which the data write is not completed in the verify operation.

20 Claims, 32 Drawing Sheets

| WL | BL | BIAS VOLTAGE | THE NUMBER OF TARGET MEMORY CELLS |
|---|---|---|---|
| SELECTED | SELECTED | Vset-0 | 1 |
| SELECTED | NON-SELECTED | 0 | 1024-1 |
| NON-SELECTED | SELECTED | Vset-VuselWL | 1024-1 |
| NON-SELECTED | NON-SELECTED | 0-VuselWL | 1M-(1K+1023) |

ELECTRICALLY REWRITABLE NONVOLATILE SEMICONDUCTOR STORAGE DEVICE INCLUDING A VARIABLE RESISTIVE ELEMENT

CROSS-REFERENCE TO RELATED APPLICATIONS

This application is based upon and claims the benefit of priority from the prior Japanese Patent Application No. 2009-70862, filed on Mar. 23, 2009, the entire contents of which are incorporated herein by reference.

BACKGROUND OF THE INVENTION

1. Field of the Invention

The present invention relates to a nonvolatile semiconductor storage device, particularly to a nonvolatile semiconductor storage device that can electrically be rewritable using a variable resistive element.

2. Description of the Related Art

Recently a resistance change memory receives attention as a successor candidate of a flash memory. At this point, it is assumed that the resistance change memory device includes a Phase Change RAM (PCRAM) in which pieces of information on resistance values of a crystalline state (conductor) and an amorphous state (insulator) are stored in a recording layer made of chalcogenide in addition to a narrow-defined Resistive RAM (ReRAM) in which a resistance value state of a recording layer made of transition metal oxide is stored in a nonvolatile manner.

It is well known that a variable resistive element of the resistance change memory has two kinds of operation modes. First, the operation mode is called a bipolar type in which a high resistance state and a low resistance state are set by switching polarities of an applied voltage. Second, the operation mode is called a unipolar type in which the high resistance state and the low resistance state can be set without switching the polarities of the applied voltage by controlling a voltage value and a voltage applied time.

Preferably the unipolar type is used in order to implement a high-density memory cell array. This is because, for the unipolar type, the cell array can be formed without use of a transistor by forming a cross-point type memory cell in which a variable resistive element and a rectifying element such as a diode overlap each other in an intersecting portion of a bit line and a word line. Further, a large capacity can be realized without increasing a cell array area by three-dimensionally stacking and arraying the memory cell arrays (for example, see JP2005-522045 and M. Johnson, et al., 512-Mb PROM With a Three-Dimensional Array of Diode/Antifuse Memory Cells, IEEE JOURNAL OF SOLID-STATE CIRCUITS, VOL. 38 No. 11, NOVEMBER 2003, p. 1920).

JP2005-522045 discloses a phase change memory device having a three-dimensional memory cell array structure in which the memory cell arrays are stacked on a semiconductor substrate. In the phase change memory device, the bit line connected to the selected memory cell is controlled from an "H" level to an "L" level, and the word line connected to the selected memory cell is controlled from the "L" level to the "H" level, thereby passing a current through the selected memory cell. Binary data is written and read by detecting the current.

However, most non-selected memory cells on the memory cell array are connected to word lines and bit lines that are different from the word line and bit line connected to the selected memory cell, and a bias voltage opposite the selected memory cell is applied to the non-selected memory cells. As a result, a leakage current is generated in the non-selected memory cells to increase a consumption current.

Because the number of memory cells that can simultaneously be selected is restricted from a relationship with the leakage current, it is necessary to perform sequential access every several bytes in the chip in order to perform page access every several kilobytes similar to that of the flash memory, which causes a problem in that a processing speed is lowered.

SUMMARY OF THE INVENTION

According to an aspect of the present invention, there is provided a nonvolatile semiconductor storage device including: a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks; and a control circuit that controls the data write circuit to perform page write in each write unit including a predetermined number of memory cells, pieces of data being written in the page in the page write, the control circuit performing the page write by repeating a step including a program operation and a verify operation, and the control circuit performing the program operation and the verify operation in a next step or later only to the write unit in which the data write is not completed in the verify operation.

According to another aspect of the present invention, there is provided a nonvolatile semiconductor storage device including: a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks, the data write circuit of the certain bank not supplying the bias voltage when a bias prevention signal is activated, the bias prevention signal preventing the supply of the bias voltage for a data write circuit belonging to the bank in which the data write is not required; a control circuit that controls the data write circuit to perform page write in each write unit including a predetermined number of memory cells, pieces of data being written in the page in the page write, the control circuit performing the page write by repeating a step including a program operation and a verify operation; and a write data inspection circuit that inspects write data to activate the bias prevention signal.

According to still another aspect of the present invention, there is provided a nonvolatile semiconductor storage device including: a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks, the data write circuit of the certain bank not supplying the bias voltage when a bias prevention signal is activated, the bias prevention signal preventing the supply of the bias voltage for a data write circuit belonging to the bank in which the data write is not required; a control circuit that controls the data write circuit to perform page write in each write unit including a predetermined number of memory cells, pieces of data being written in the page in the page write, the control circuit performing the page write by repeating a step including a program operation and a verify operation; and a write data inspection circuit that inspects write data, the write data belonging to the different write units and the same bank, the write data inspection circuit activating the bias prevention signal when the write data is the data in which the data write is not required.

DETAILED DESCRIPTION OF THE EMBODIMENTS

A nonvolatile memory according to an exemplary embodiment of the invention will be described in detail below with reference to the drawings.

First Embodiment

Figure 1:
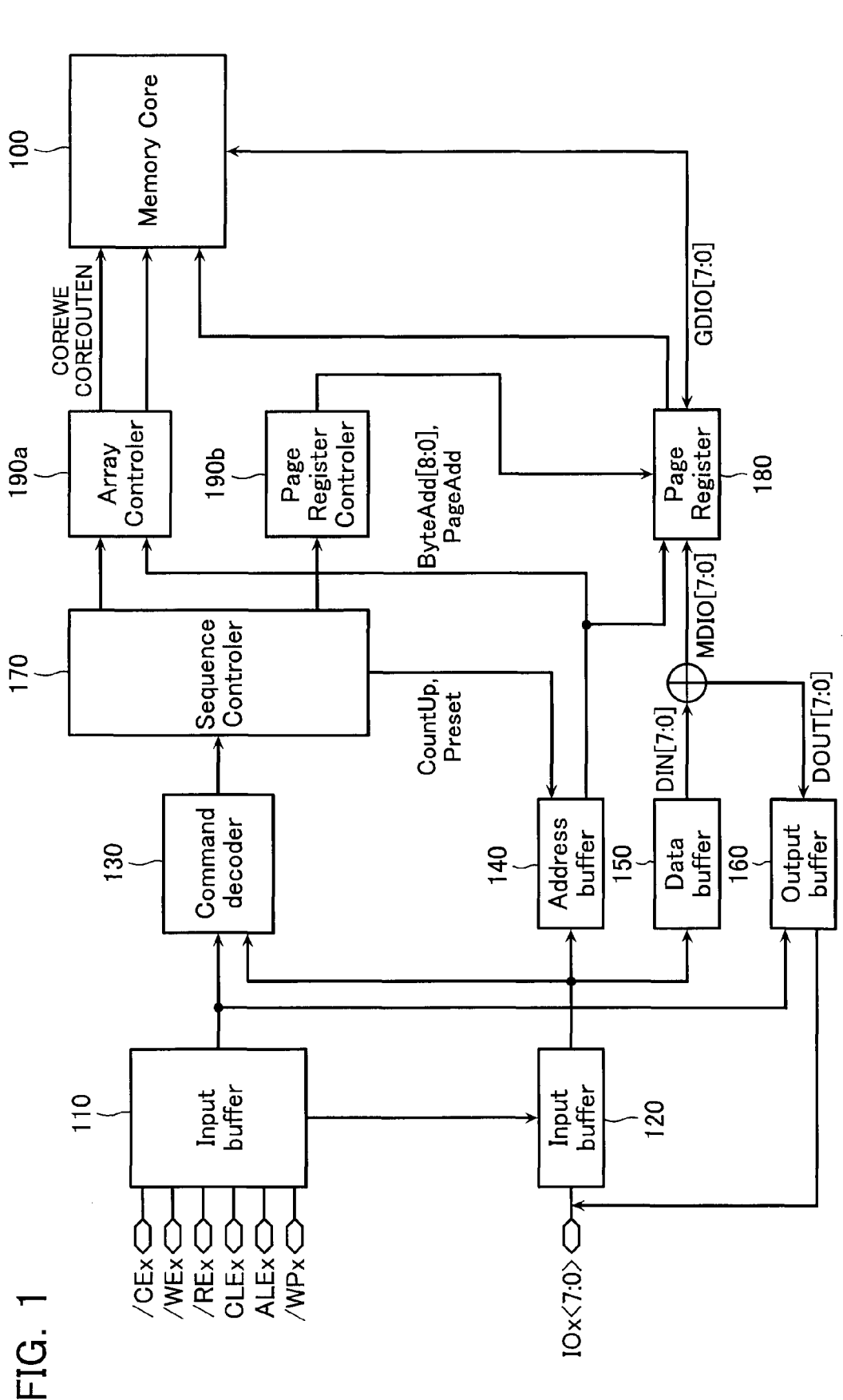
FIG. 1 is a functional block diagram of a nonvolatile memory according to a first embodiment of the invention.

FIG. 1 is a functional block diagram of a nonvolatile memory according to a first embodiment of the invention.

Figure 2:
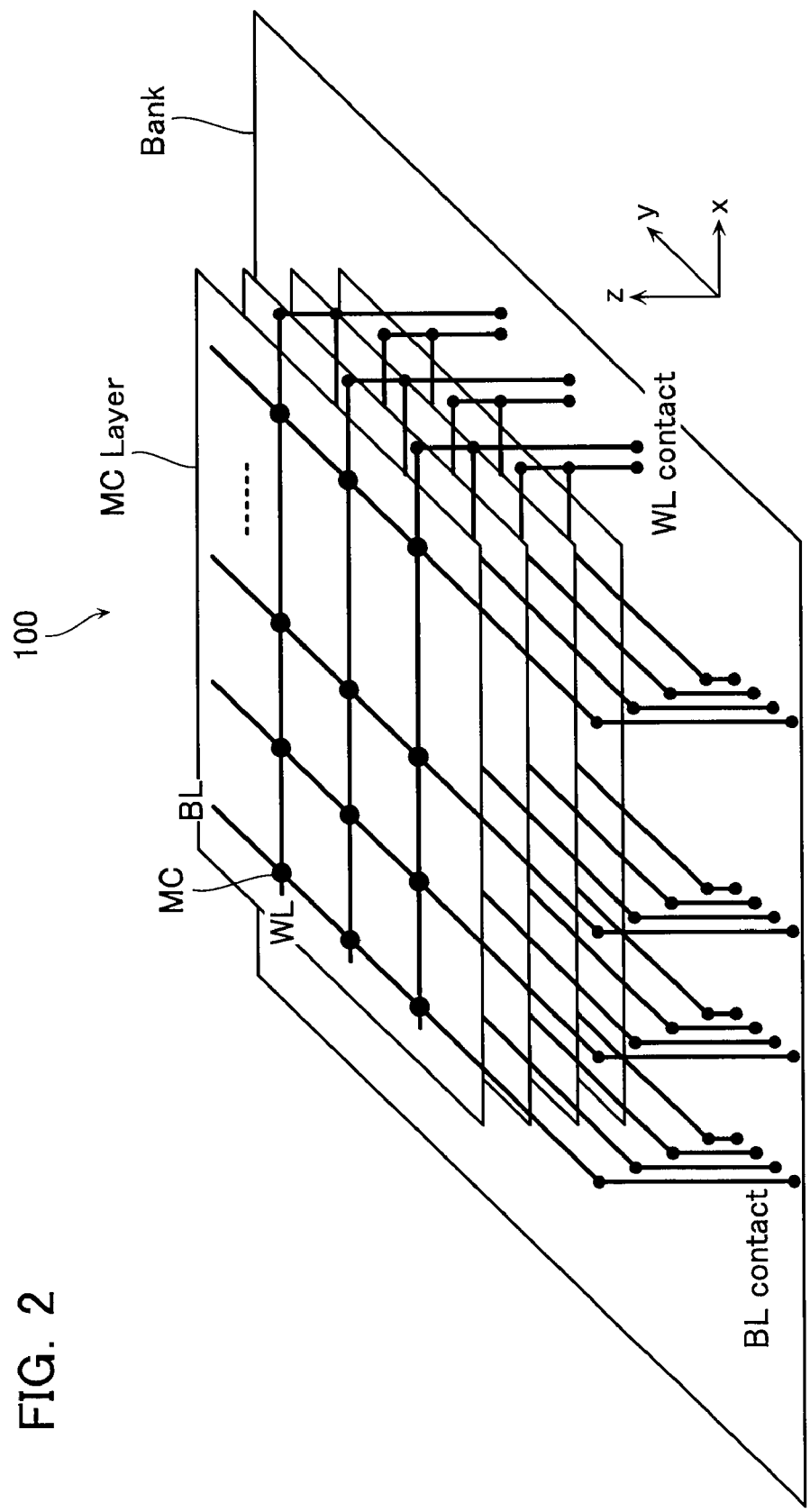
FIG. 2 illustrates a memory core of the nonvolatile memory of the first embodiment.

The nonvolatile memory of the first embodiment includes a memory core 100. The memory core 100 includes plural banks that are three-dimensionally disposed as illustrated in FIG. 2. In each of the banks, plural memory cell array layers are laminated. The memory cell array layer includes plural word lines WL extending in a row direction (x-direction of FIG. 2), plural bit lines BL extending in a column direction (y-direction of FIG. 2) intersecting the word lines WL, and memory cells MC each of which is provided in each intersection portion of the word line WL and the bit line BL. Each memory cell array layer is connected to a silicon substrate disposed below the memory cell array layer through a word line contact and a bit line contact, which are provided at one end of each of the word line WL and the bit line BL. A sense amplifier circuit that is connected to the bit line BL, a register circuit in which write data is temporarily stored, and each logical circuit that includes in-bank decoders of the word line WL and bit line BL are disposed on the silicon substrate.

The nonvolatile memory includes input buffers 110 and 120 that become interfaces between the nonvolatile memory and the outside to receive control pin information and I/O pin information, a command decoder 130 that interprets a command, an address buffer 140 that retains an address provided from the input buffer 120, a data buffer 150 that retains input data provided from the input buffer 120, and an output buffer 160 that taps off data to the outside. The nonvolatile memory also includes a sequence controller 170 that controls access of the memory core 100, a page register 180 that retains data and performs data input/output to the memory core 100, an array controller 190a that controls the memory core 100, and a page register controller 190b that controls the page register 180 as a control circuit.

Based on the control pin information of the nonvolatile memory, the input buffer 110 performs the data input/output of the I/O pin, distinguishes among the command, the address, and the data, and recognizes a state of write protect and the like. Examples of the control pin information include a chip enable signal /CEx that selects the nonvolatile memory, a write enable signal /WEx that takes the command, address, and data on the I/O pin in the nonvolatile memory, a read enable signal /REx that permits the data output from the I/O pin, a command latch enable signal CLEx that is used to take the command in the nonvolatile memory, an address latch enable signal ALEx that is used to take the address or input data in the nonvolatile memory, and a write protect signal /WPx that is used to protect the storage data in an unstable period such as a period immediately after the power-on.

The input buffer 120 receives the input data from the outside through the I/O pin formed by a bidirectional bus. The input buffer 120 is controlled by a signal that is transmitted from the input buffer 110 based on the control pin information. In response to the signal, the input buffer 120 sorts the input data into the command decoder 130, address buffer 140, or data buffer 150.

The command decoder 130 interprets the command transmitted from the input buffer 120, and the command decoder 130 starts up the sequence controller 170 if needed.

The address buffer 140 retains the address transmitted from the input buffer 120, and the address buffer 140 transmits the address to the array controller 190a or the page register 180. Finally the address is used to make a determination of selection/non-selection of the word line WL and bit line BL of the memory cell MC. The address buffer 140 receives an instruction of the sequence controller 170 if needed, and the address buffer 140 performs address initialization (Preset) and counter increment (CountUp).

The data buffer 150 temporarily retains the input data transmitted from the input buffer 120, and the data buffer 150 transmits the input data as write data to the page register 180 through an input data bus DIN and an internal bidirectional data bus MDIO[7:0]. On the other hand, during the data output, the data buffer 150 stops the transmission of the write data to the page register 180 to avoid collision of the write data and read data in the internal bidirectional data bus MDIO[7:0].

The output buffer 160 receives the read data transmitted from the page register 180 through the internal bidirectional data bus MDIO[7:0] and an output data bus DOUT[7:0], and the output buffer 160 taps off the read data as the output data to the outside through the I/O pin. The output buffer 160 taps off ID information on the memory cell MC and the like in addition to the read data. The output buffer 160 also plays a role in stopping the drive of the I/O pin except for the data read operation.

The sequence controller 170 controls the whole of the data read, write, and erasing operations of the nonvolatile memory. The control of the sequence controller 170 also includes an instruction to supply a bias voltage necessary for the memory cell array and an instruction (CountUp and Preset) to change the address to the address register 140.

The page register 180 includes a register having at least one byte. The page register 180 retains the write data written in the memory cell array and the read data read from the memory cell array through a common data bus GDIO[7:0].

The array controller 190a and the page register controller 190b are started up by an instruction from the sequence controller 170. The array controller 190a supplies the bias voltage necessary for the memory cell array, and the array controller 190a controls the start-up of the sense amplifier circuit disposed below the memory cell array and an operation of the register circuit. The page register controller 190b controls the page register 180.

Figure 3:
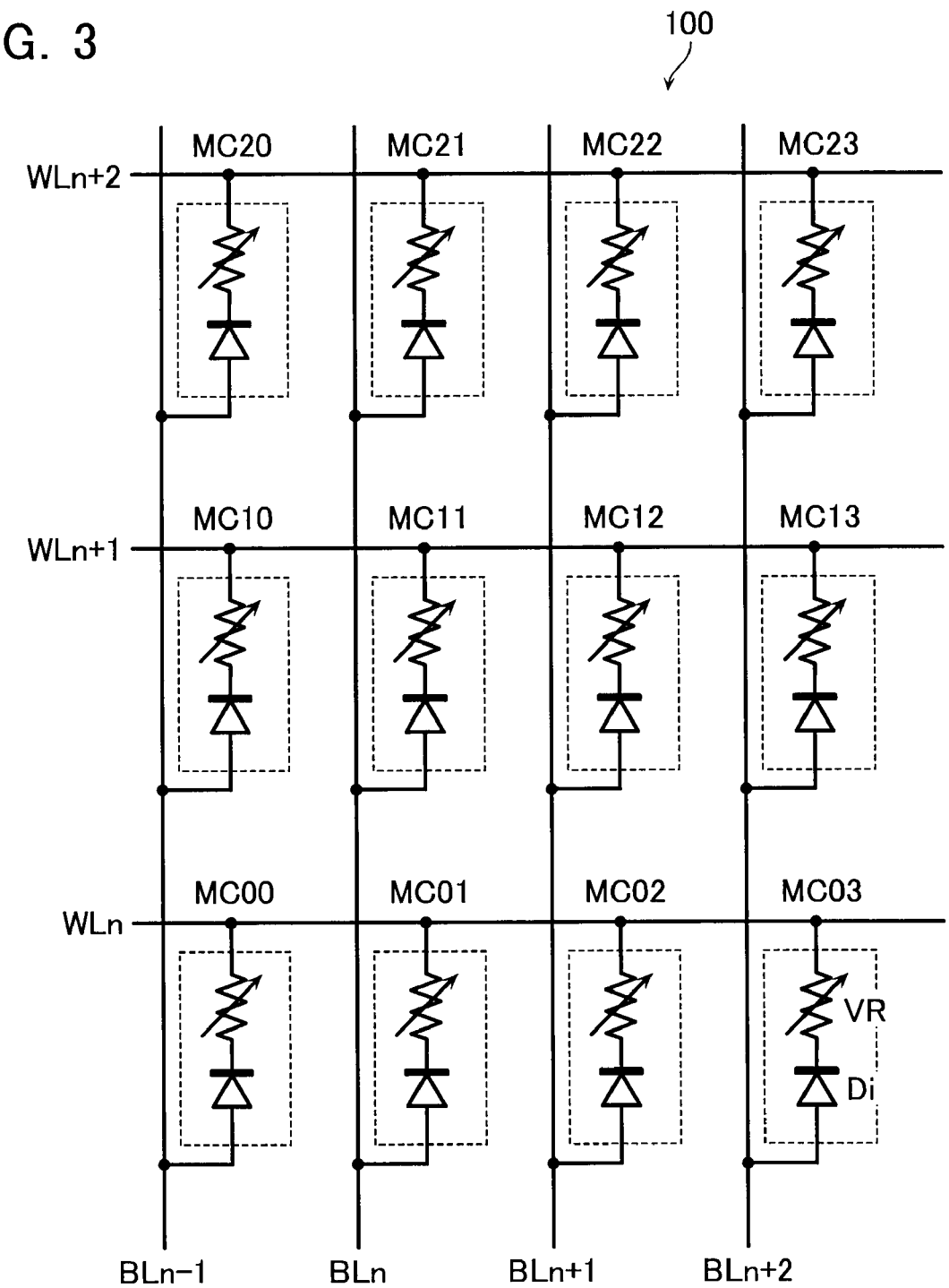
FIG. 3 is an equivalent circuit diagram of a memory cell array of the nonvolatile memory of the first embodiment.

FIG. 3 is an equivalent circuit diagram of a memory cell array of the memory core 100 of FIG. 2.

FIG. 3 illustrates the three word lines WL, the four bit lines BL, and the 12 memory cells MC that are provided in the intersection portions of the word lines WL and the bit lines BL. In each memory cell MC, a diode Di and a variable resistive element VR are connected in series. An anode of the diode Di is connected to the bit line BL, and the variable resistive element VR is connected between a cathode of the diode Di and the word line WL. The dispositions and polarities of the diode Di and variable resistive element VR constituting the memory cell MC are not limited to the configuration of FIG. 3. A switching transistor may be disposed instead of the diode Di.

For example, in the variable resistive element VR having a structure of electrode/transition metal oxide/electrode, the resistance value of metal oxide changes by conditions of applying the voltage, current, and heat, and the states of the different resistance values are stored as the information in the nonvolatile manner. More specifically, examples of the variable resistive element VR include an element (PCRAM) in which the resistance value changes by a phase transition between a crystalline state and an amorphous state like chalcogenide, an element (CBRAM: Conductive Bridging RAM) in which the resistance value changes by depositing a metallic positive ion to form a conducting bridge between electrodes or by ionizing the deposited metal to break the conducting bridge, an element (ReRAM) in which the resistance value changes by applying the voltage or current (roughly classified into an element in which the resistance value changes by the presence or absence of charges trapped in a charge trap existing at an electrode interface and an element in which the resistance value changes by the presence or absence of a conduction path caused by oxygen loss.

For the unipolar type ReRAM, in writing the data in the memory cell MC, for example, the voltage of 3.5V (actually about 4.5V when voltage drop of the diode Di is included) and the current of about 10 nA are applied to the variable resistive element VR for about 10 ns to about 100 ns. Therefore, the variable resistive element VR is changed from the high resistance state to the low resistance state. Hereinafter the operation for changing the variable resistive element VR from the high resistance state to the low resistance state is referred to as a set operation.

After the set operation, for example, the voltage of 0.8V (actually about 1.8V when voltage drop of the diode Di is included) and the current of about 1 µA to about 10 µA are applied to the variable resistive element VR in the low resistance state for about 500 ns to about 2 µs. Therefore, the variable resistive element VR is changed from the low resistance state to the high resistance state. Hereinafter the operation for changing the variable resistive element VR from the low resistance state to the high resistance state is referred to as a reset operation.

Figures 4, 5:
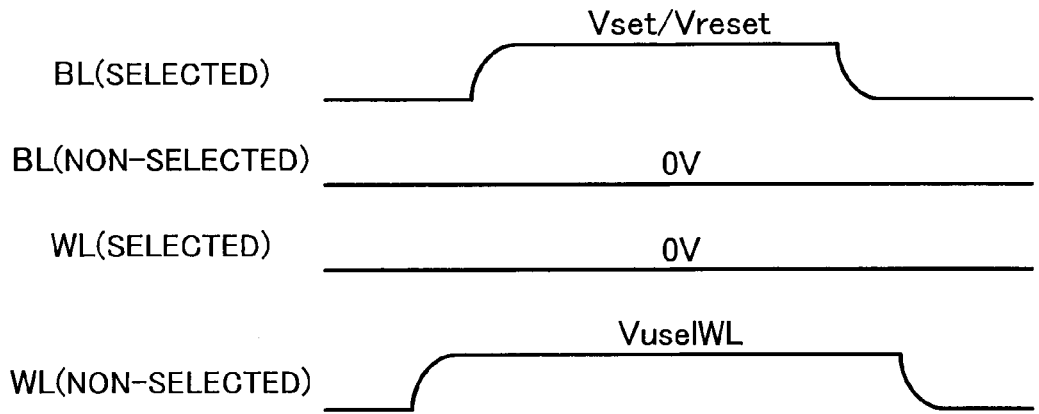
FIG. 4 illustrates a voltage waveform supplied to each wiring during data write in the nonvolatile memory of the first embodiment.
FIG. 5 illustrates a relationship among each wiring state, a bias voltage applied to a memory cell, and the number of target memory cells in the nonvolatile memory of the first embodiment.

FIG. 4 illustrates an operation waveform during set/reset operation performed to the memory cell array of FIG. 3.

Usually all the word lines WL and all the bit lines BL are set to "L" (0V). At this point, voltages Vset/Vreset necessary for the set/reset operations are applied to the selected bit line BL, and a voltage VuselWL that is higher than the voltages Vset/Vreset is applied to the non-selected word lines WL. In this case, a forward bias is applied to the diode Di of the selected memory cell MC connected between the selected word line WL and the selected bit line BL, and the resistance state of the variable resistive element VR makes a transition to the low resistance state or the high resistance state. On the other hand, a reverse bias is applied to the diode Di of the non-selected memory cells MC, the resistance state of the variable resistive element VR does not make the transition. As a result, the data can be written only in the selected memory cell MC.

FIG. 5 illustrates a relationship among the selected/non-selected states of the word line WL and bit line BL during the set operation, a bias voltage that is applied to the memory cell MC connected to the intersection portion of the word line WL and the bit line BL, and the number of target memory cells MC. In FIG. 5, it is assumed that 1024 word lines WL and 1024 bit lines BL exist while the number of memory cells MC is 1024×1024=1M. As can be seen from FIG. 5, as described above, the reverse bias (0−VuselWL) is applied to the memory cells MC connected to the non-selected word lines WL and non-selected bit lines BL, and the number of target memory cells MC becomes 1M−(1K+1023). That is, when the data write is performed to one selected memory cell MC, it is necessary to apply the reverse bias to most non-selected memory cells MC in the bank, and the reverse bias leakage causes the increase in consumption current. Accordingly, the prevention of the reverse bias leakage can achieve the low power consumption of the nonvolatile memory.

Before a page operation of the first embodiment, write/erasing operations of a NAND flash memory will be described as a comparative example.

Figure 32:
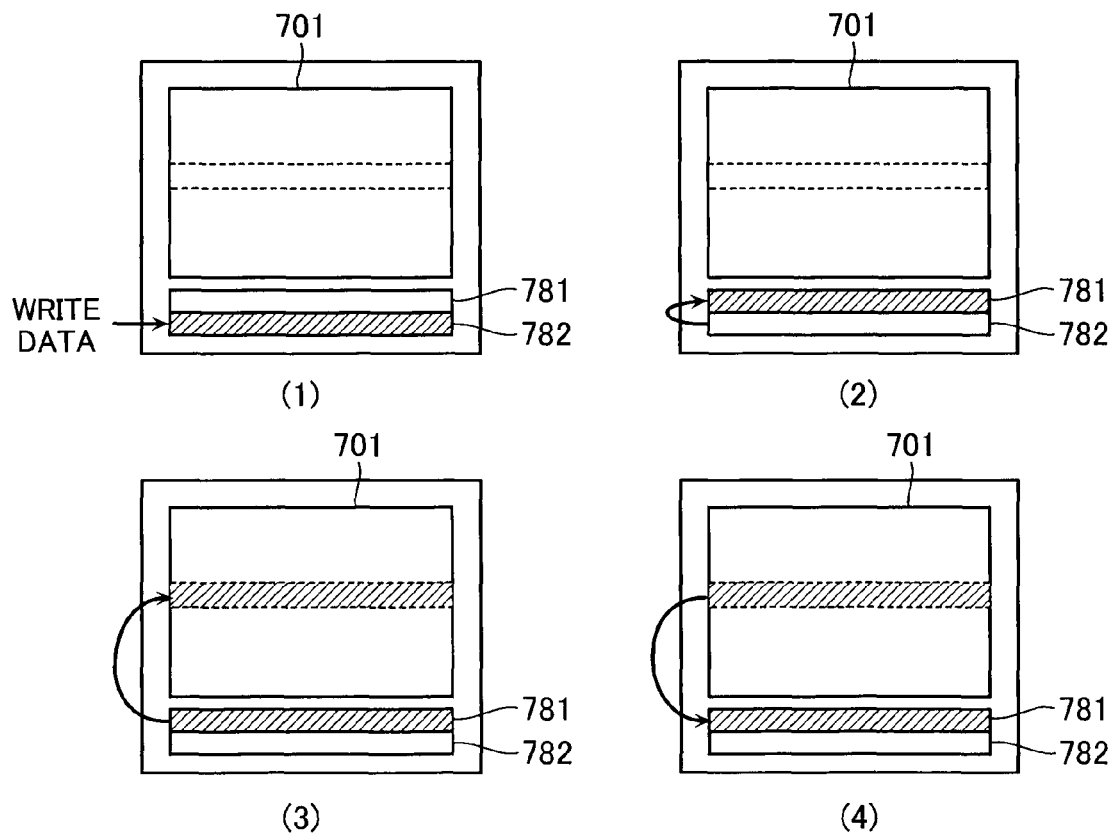
FIG. 32 illustrates a page write operation in a NAND flash memory.

FIG. 32 illustrates the write operation performed to the NAND flash memory. The write operation of the NAND flash memory is performed in units of pages.

In FIG. 32(1), the input data provided from the outside is retained as the write data in a cache register 782. The cache register 782 has a storage region of at least a page length, and the cache register 782 can retain the pieces of write data of one page.

In FIG. 32(2), the pieces of write data of one page retained in the cache register 782 is copied to the data register 781.

In FIG. 32(3), the pieces of write data of one page copied to the data register 781 are collectively programmed into a certain selected page of the memory cell array 701.

In FIG. 32(4), the verification is performed by comparing the pieces of data programmed into the selected page and pieces of original data stored in the data register 781. At this point, when the number of fail bits falls within a permissible range, the page write operation is completed. On the other hand, when the number of fail bits is out of the permissible range, the pieces of processing of FIGS. 32(3) and 32(4) are repeated until the number of fail bits falls within the permissible range.

The erasing operation is performed by block unit including plural pages, for example, 32 pages.

Figure 33:
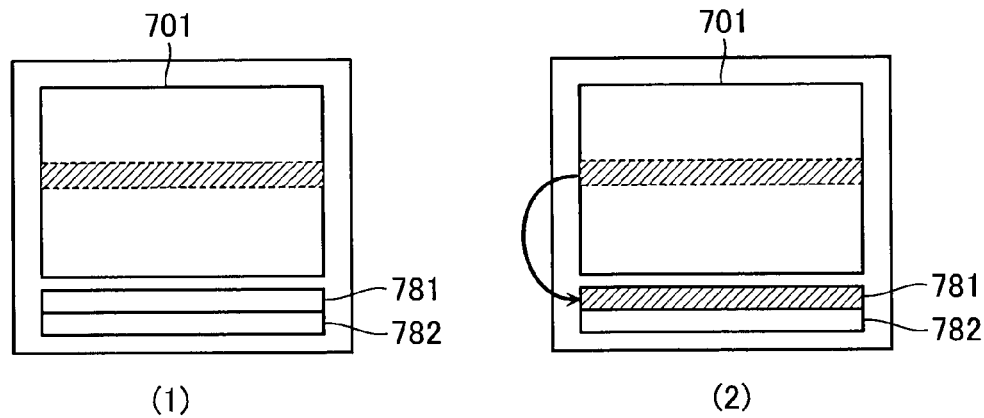
FIG. 33 illustrates a block erasing operation in the NAND flash memory.

After the certain selected block of the memory cell array 701 is collectively erased in FIG. 33(1), the verification is performed by comparing the selected block and the data register in FIG. 33(2), and the pieces of processing of FIGS. 33(1) and 33(2) are repeated until the selected block is erased.

Figure 6:
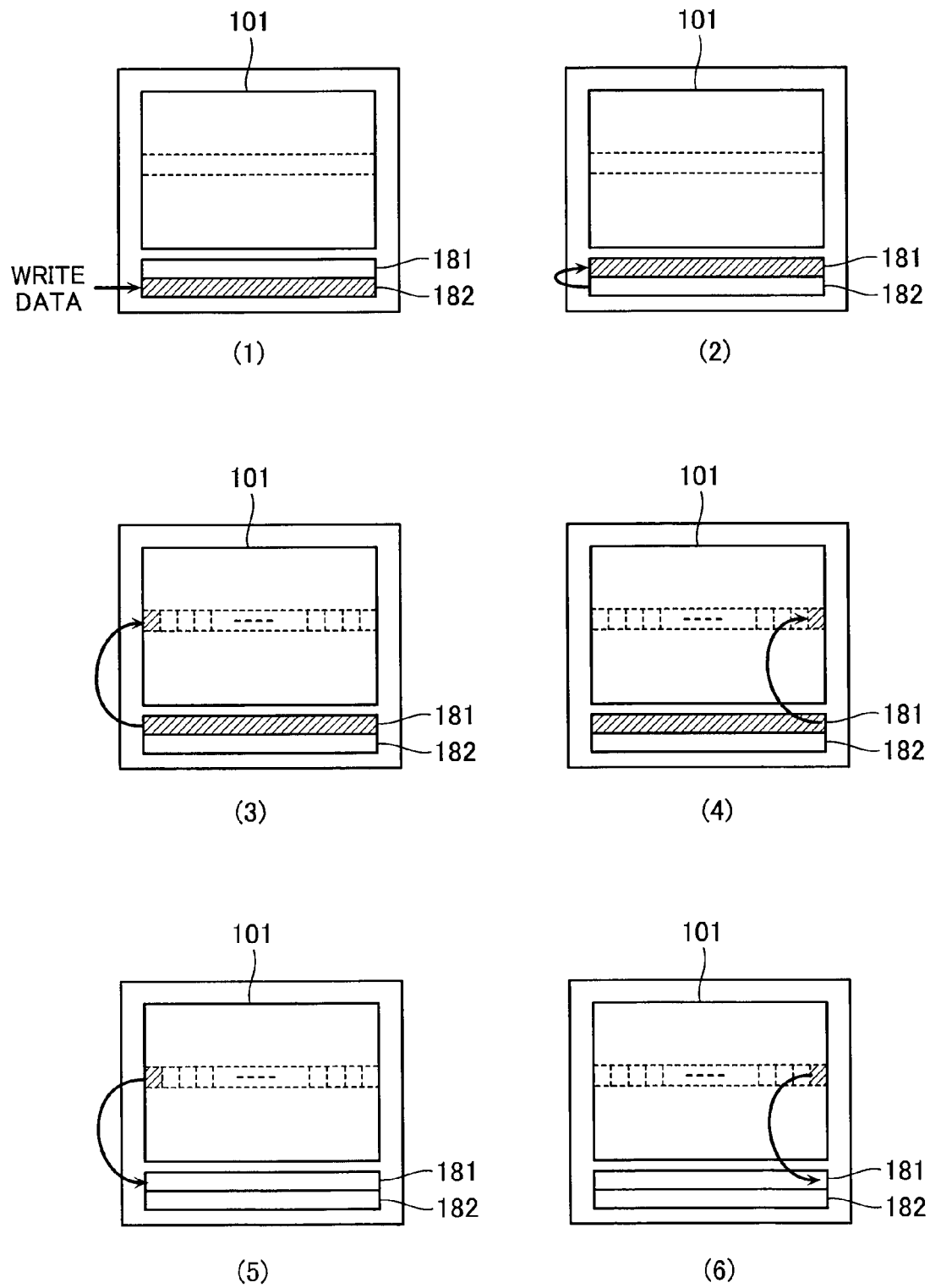
FIG. 6 illustrates a page write operation in the nonvolatile memory of the first embodiment.

FIG. 6 illustrates a page write operation in the nonvolatile memory of the first embodiment.

In FIG. 6(1), the input data provided from the outside is retained as the write data by a cache register 182.

In FIG. 6(2), the write data retained by the cache register 182 is copied into a data register 181.

In FIGS. 6(3) and 6(4), the data retained by the data register 181 is divided into some pieces of data having a write unit and programmed every write unit. For example, for one page of 2 k bytes and the write unit of 128 bytes, the program operation is repeated 16 times at the maximum. Hereinafter the one program operation or verify operation performed to the write unit is referred to as "one cycle".

In FIGS. 6(5) and 6(6), as with the program operation, the verify operation is performed every write unit. After the verify operation of one page is performed, the page write operation is completed when the number of fail bits falls within a permissible range. On the other hand, when the number of fail bits is out of the permissible range, the pieces of processing of FIGS. 6(3) to 6(6) are repeated until the number of fail bits falls within the permissible range.

Since the page erasing operation is similar to the page write operation, the description is not repeated here.

The page write operation of FIGS. 6(3) to 6(6) will be described in detail along with the page write operation of the comparative example.

Figure 7:
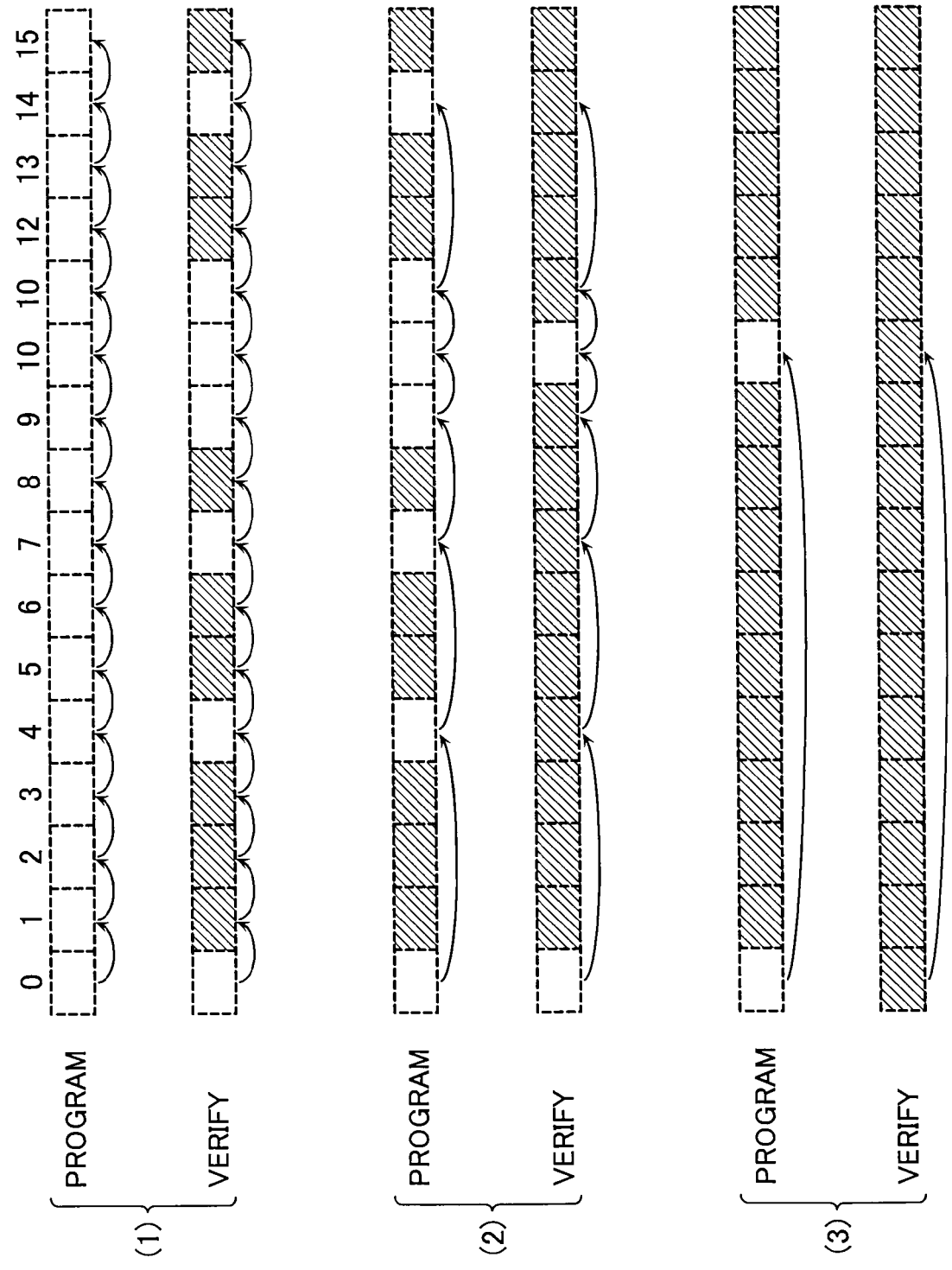
FIG. 7 illustrates the page write operation in the nonvolatile memory of the first embodiment.
Figure 34:
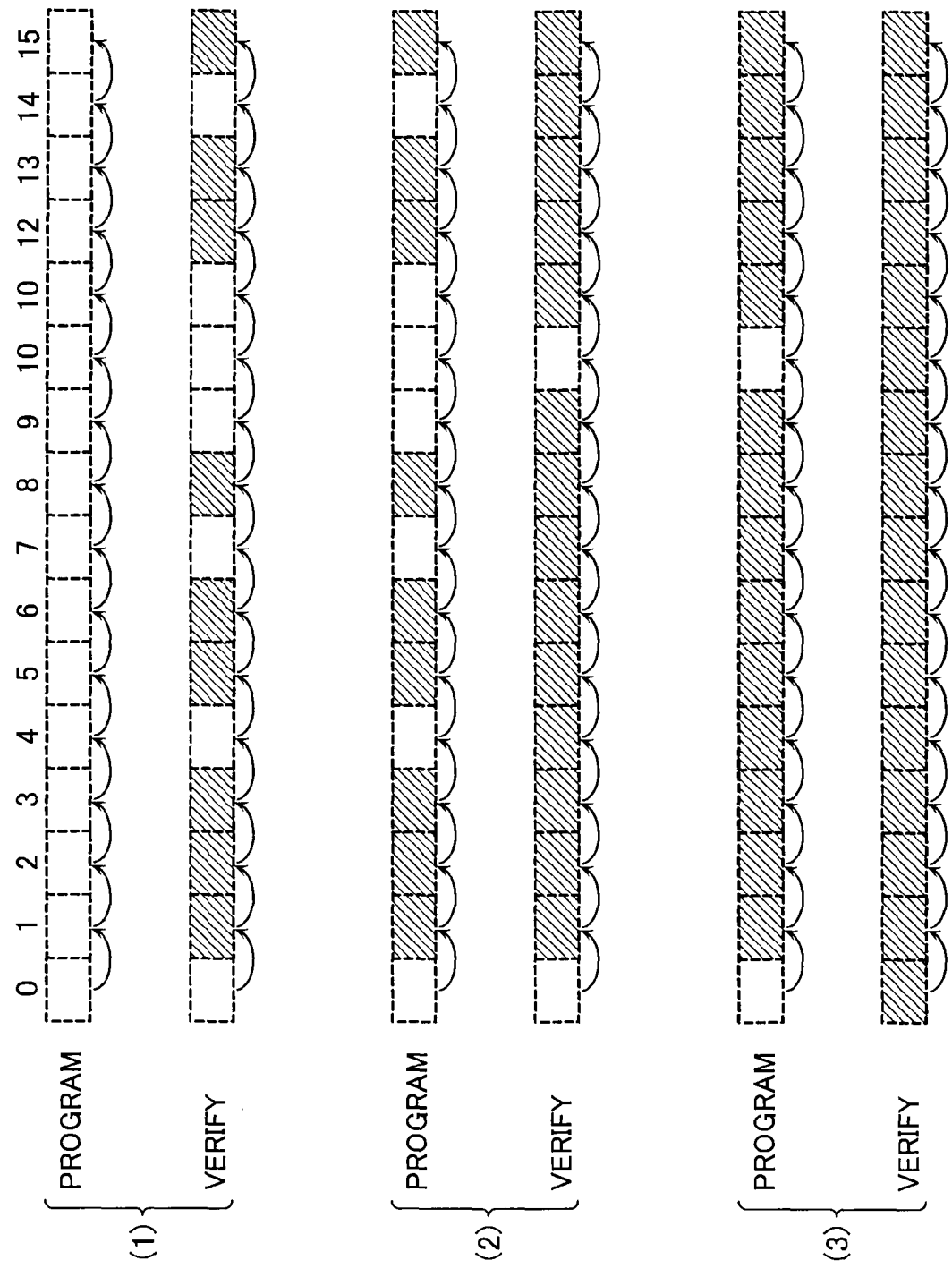
FIG. 34 illustrates a page write operation in a comparative example of the first embodiment.

FIGS. 7 and 34 illustrate the program operation and verify operation in each step of the first embodiment and the comparative example. In FIG. 7, a square expressed by a dotted line indicates the write unit, a hatched square indicates the write unit in which the data write is completed, and a non-hatched square indicates the write unit in which the data write is not completed due to the presence of the fail bit or in which the data write not started. FIG. 7 illustrates the page write operation performed to the page including 16 write units <0> to <15>.

For the comparative example, as illustrated in FIGS. 34(1) to 34(3), after the program operation is sequentially performed to all the write units irrespective of the completion of the data write, the sequential verify operation is performed to all the write units. Accordingly, 32 cycles are required per one step of the program operation and verify operation, and 96 cycles are required in total for the three steps.

On the other hand, for the first embodiment, in the first step of FIG. 7(1), as with the comparative example, after the sequential program operation is performed to all the write units, the sequential verify operation is performed to all the write units. In the verify operation of the first step, it is assumed that nine write units such as the write units <1> and <2> pass the verification. The processing time of 32 cycles is required for the first step.

Then, in the second step of FIG. 7(2), the program operation and the verify operation are performed while the nine write units, such as the write units <1> and <2>, which pass the verification in the first step are skipped. In the verify operation of the second step, it is assumed that five write units such as the write units <4> and <7> newly pass the verification. The processing time of 14 cycles is required for the second step.

Then, in the third step of FIG. 7(3), the program operation and the verify operation are performed while the 14 write units, such as the write units <1> and <2>, which pass the verification in the first and second steps are skipped. It is assumed that all the write units pass the verification at the end of the third step. The processing time of four cycles is required for the third step.

Thus, for the first embodiment, the processing time of 50 cycles is required for the first to third steps, and the processing speed can be enhanced compared with the comparative example. Therefore, the low power consumption can be realized.

An internal configuration of the nonvolatile memory that realizes the page write operation of FIG. 7 will be described below.

Figure 8:
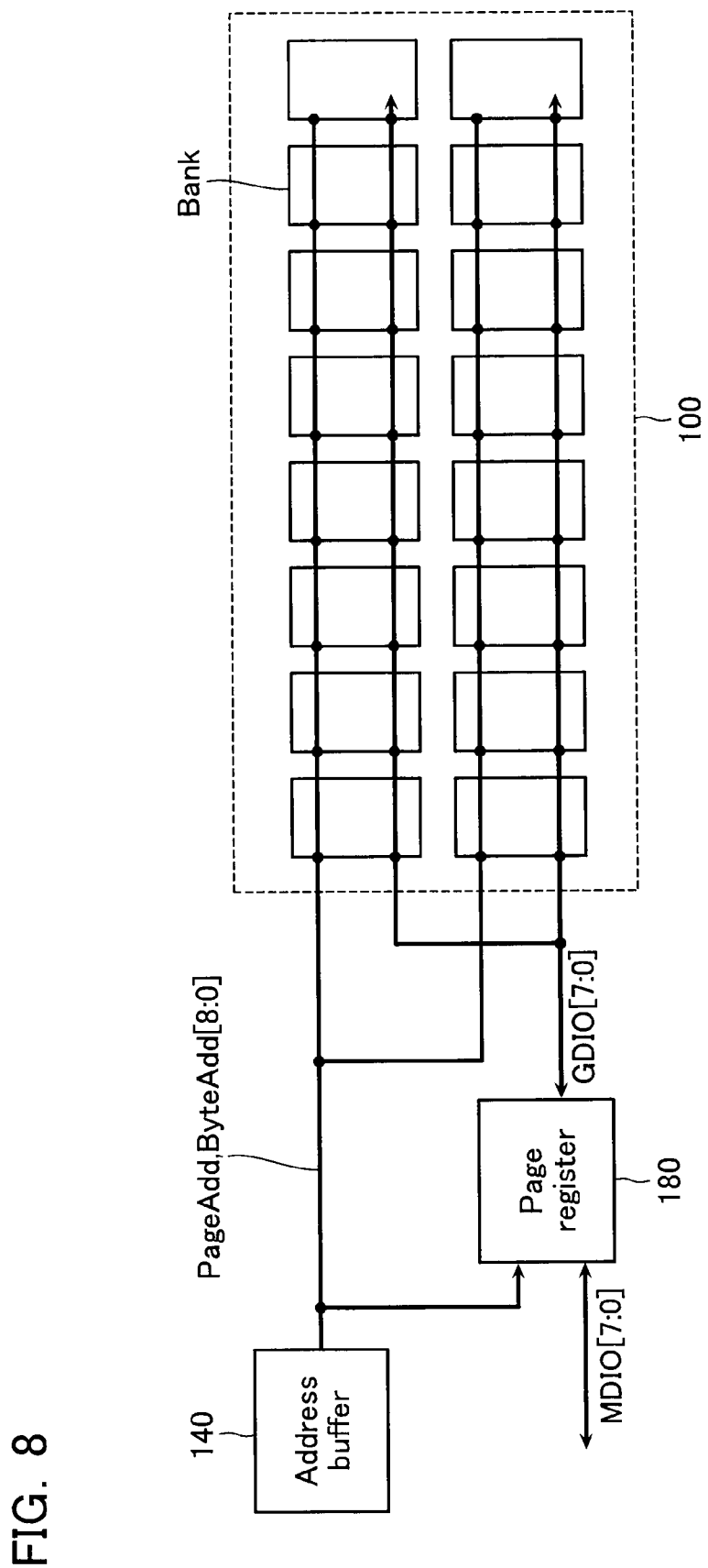
FIG. 8 illustrates a signal connection relationship among an address buffer, a page register, and a bank in the nonvolatile memory of the first embodiment.

FIG. 8 illustrates a signal connection relationship among an address buffer 140, a page register 180, and a memory core 100 including plural banks in the nonvolatile memory of the first embodiment. At this point, the memory core 100 includes 16 banks. It is assumed that one page includes 512 bytes, and it is assumed that the write unit includes 16 bytes while each bank has one byte. Accordingly, one step of the program operation and verify operation is processed up to 64 cycles.

The address buffer 140 commonly transmits each signal of a page address PageAdd and a column address ByteAdd[8:0] in one page to the banks of the memory core 100.

Figure 9:
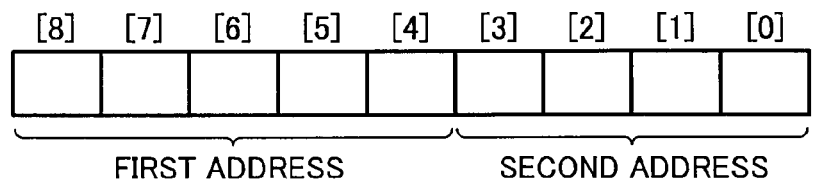
FIG. 9 illustrates a configuration of a column address in the nonvolatile memory of the first embodiment.

As illustrated in FIG. 9, the column address ByteAdd[8:0] includes a first address portion ByteAdd[8:4] that specifies the write unit and a second address portion ByteAdd[3:0] that specifies the bank.

The page register 180 performs the data input/output to the input buffer 120 and the output buffer 160 through the internal bidirectional data bus GDIO[7:0] connected onto the input/output pin side. The page register 180 performs the data input/output to each bank through the common data bus GDIO[7:0] connected onto the side of the memory core 100.

Figure 10:
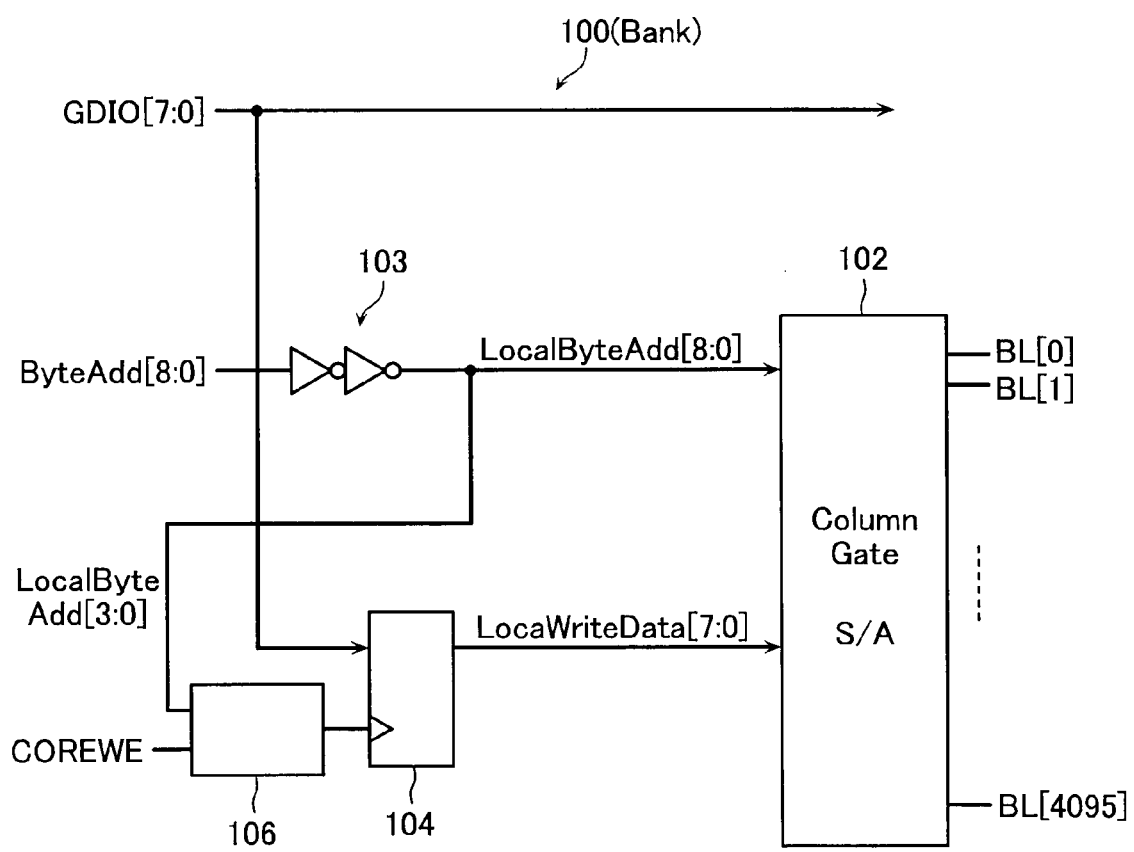
FIG. 10 illustrates an internal configuration example of the bank in the nonvolatile memory of the first embodiment.

FIG. 10 illustrates an internal configuration example of each bank.

After passing through a buffer circuit 103 (two buffers are inserted in FIG. 10) if needed, the column address ByteAdd [8:0] transmitted from the address buffer 140 is transmitted as a local column address LocalByteAdd[8:0] to a column gate and a sense amplifier 102. Among the column address ByteAdd[8:0], a local column address LocalByteAdd[3:0] corresponding to the second address portion that specifies the bank is transmitted to a bank address decoder 106.

In addition to the column address ByteAdd[3:0], the bank address decoder 106 receives a write permission signal COREWE transmitted from the array controller 190a. The bank address decoder 106 notifies the local data latch 104 of data latch timing on the condition that the write permission signal COREWE is activated while the local column address LocalByteAdd[3:0] corresponding to the second address portion specifies the bank.

After the local data latch 104 receiving the notification latches the write data existing in the common data bus GDIO [7:0] in the data latch timing, the local data latch 104 transmits the write data as local write data LocalWriteData[7:0] to the column gate and the sense amplifier 102.

Finally the column gate and the sense amplifier 102 that receive the local column address LocalByteAdd[8:0] and the local write data LocalWriteData[7:0] select the certain bit line BL on the basis of these signals, and the column gate and the sense amplifier 102 supply the reverse bias voltage to other non-selected bit lines BL.

A procedure of the page write operation will be described with reference to FIG. 11.

In S101, a pass storage latch (not illustrated) prepared every write unit is initialized. The pass storage latch is a flag in which whether each write unit passes the verification is stored.

In S102, the column address ByteAdd is initialized to zero.

In S103, a determination whether the write unit (hereinafter referred to as "target write unit") specified by the column address ByteAdd passes the verification is made. When the target write unit passes the verification, pieces of processing in S104 and S105 (described later) are skipped.

In S104, the write data corresponding to the target write unit is transmitted from the page register 180 to each bank.

In S105, the write data transmitted in S104 is programmed every bank.

In S106, a determination whether the target write unit is a final write unit in the page is made. When the target write unit is not the final write unit, in S107, 16 (corresponding to the write unit length) are added to the current column address ByteAdd in order to set the next write unit to the target write unit, and the flow goes to S103. When the target write unit is the final write unit, the flow goes to S108.

In S108, the column address ByteAdd is initialized to zero.

In S109, a determination whether the target write unit passes the verification is made. When the target write unit passes the verification, pieces of processing in S110 to S113 (described later) are skipped.

In S110, the verify operation is performed to the target write unit. In S111, the verify result is transmitted to the page register 180.

In S112, a determination whether the target write unit passes the verification is made. When the target write unit passes the verification, the pass storage latch is set in S113.

In S114, a determination whether the target write unit is the final write unit in the page is made. When the target write unit is not the final write unit, in S115, 16 (corresponding to the write unit length) are added to the current column address ByteAdd in order to set the next write unit to the target write unit, and the flow goes to S109. When the target write unit is the final write unit, the flow goes to S116.

In S116, a determination whether all the pass storage latches are set is made. When all the pass storage latches are set, that is, when all the write units pass the verification, the page write is normally ended (Pass). On the other hand, when one of the pass storage latches is still reset, that is, when one of the write units does not pass the verification, the flow goes to S117.

In S117, a determination whether the number of steps reaches the maximum step number is made. The maximum step number is previously set in consideration of the permissible time for the page write or a stress on the memory cell MC caused by the data write. When the number of steps does not reach the maximum step number, the flow goes to S102. When the number of steps reaches the maximum step number, the page write is determined to fail, and the page write operation is ended (Fail).

(Page Write Operation by Another Procedure)

An example in which the page write operation is performed by a procedure different from that of FIG. 11 will be described below.

Figure 11:
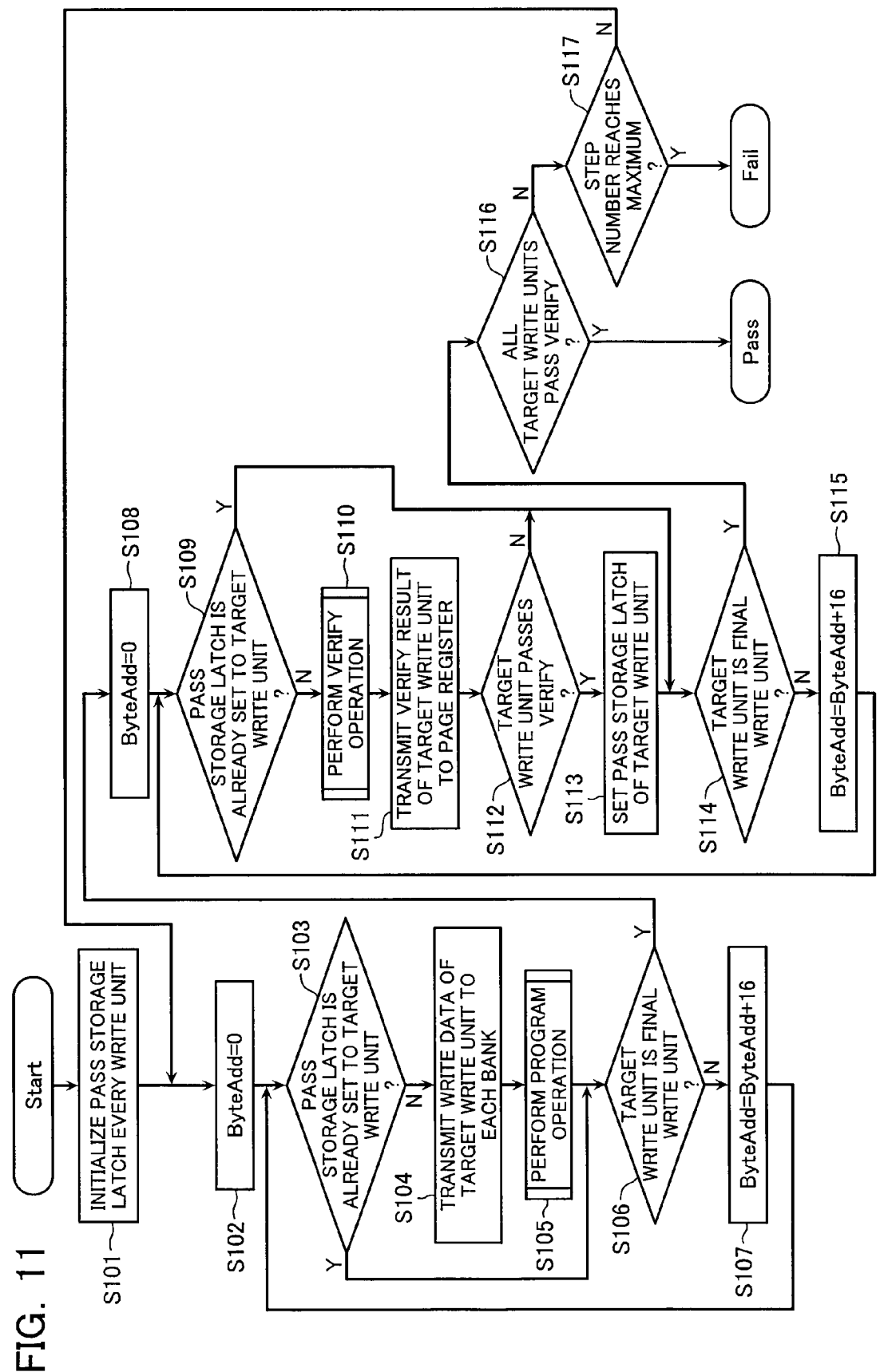
FIG. 11 is a flowchart of a page write operation in the nonvolatile memory of the first embodiment.

For the page write operation of FIG. 11, after the program operation is sequentially performed to all the write units, the verify operation is sequentially performed to all the write units.

Figure 12:
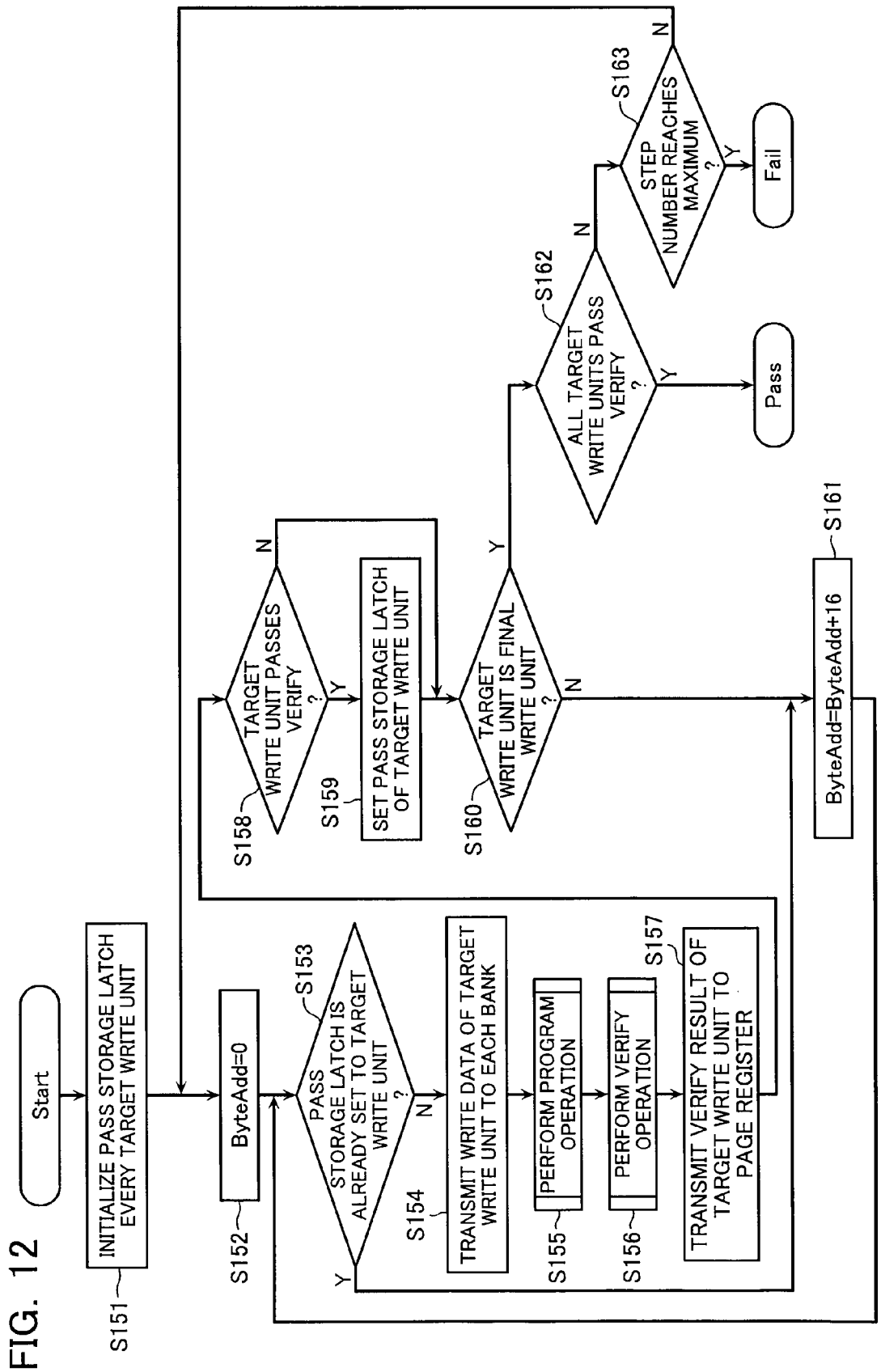
FIG. 12 is a flowchart of another page write operation in the nonvolatile memory of the first embodiment.

On the other hand, in the page write operation of FIG. 12, the program operation and the verify operation are continuously performed every write unit, and the continuous performance of the program operation and the verify operation is repeated until the final write unit in the page.

In S151, the pass storage latch prepared every write unit is initialized.

In S152, the column address ByteAdd is initialized to zero.

In S153, the determination whether the target write unit passes the verification is made. When the target write unit passes the verification, pieces of processing in S154 to S160 (described later) are skipped.

In S154, the write data corresponding to the target write unit is transmitted from the page register 180 to each bank.

In S155, the program operation is performed to the target write unit.

In S156, the verify operation is performed to the target write unit. In S157, the verify result is transmitted to the page register 180.

In S158, the determination whether the target write unit passes the verification is made. When the target write unit passes the verification, the pass storage latch is set in S159.

In S160, the determination whether the target write unit is the final write unit in the page is made. When the target write unit is not the final write unit, in S161, 16 (corresponding to the write unit length) are added to the current column address ByteAdd in order to set the next write unit to the target write unit, and the flow goes to S153. When the target write unit is the final write unit, the flow goes to S162.

In S162, the determination whether all the pass storage latches are set is made. When all the pass storage latches are set, that is, when all the write units pass the verification, the page write is normally ended (Pass). On the other hand, when one of the pass storage latches is still reset, that is, when one of the write units does not pass the verification, the flow goes to S163.

In S163, the determination whether the number of steps reaches the maximum step number is made. When the number of steps does not reach the maximum step number, the flow goes to S152. When the number of steps reaches the maximum step number, the page write is determined to fail, and the page write operation is ended (Fail).

In the first embodiment, in both the page write operation of FIG. 11 and the page write operation of FIG. 12, the program operation and verify operation in the next step are skipped for the write unit that passes the verification, so that the total number of cycles necessary for the page write operation can be decreased. As a result, the processing speed of the page write operation can be enhanced, and the power consumption can also be reduced.

Second Embodiment

A page write operation in a nonvolatile memory according to a second embodiment of the invention will be described along with a comparative example.

Figure 35:
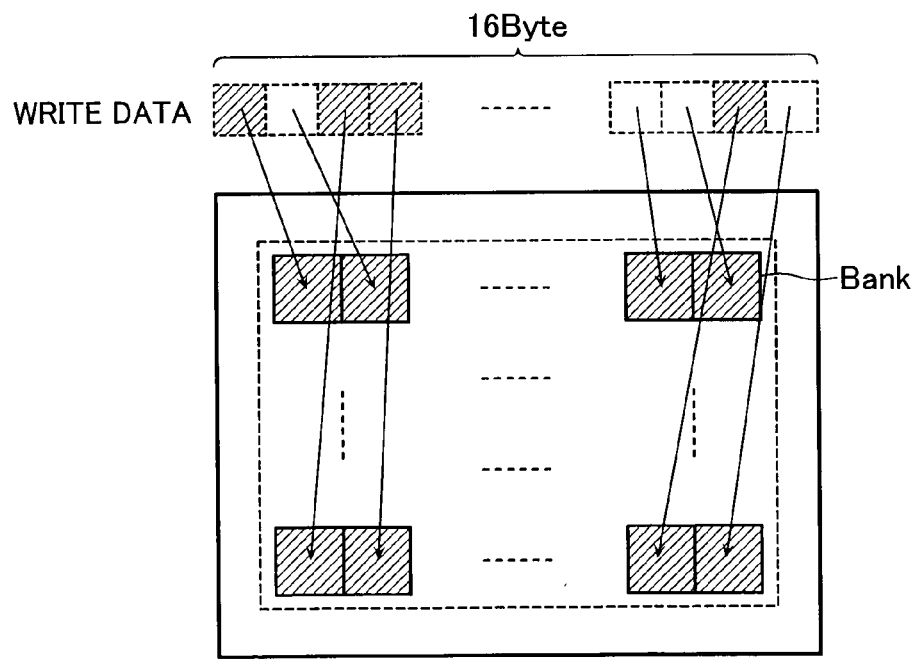
FIG. 35 illustrates a page write operation in a comparative example of the second embodiment.

FIG. 35 illustrates the page write operation in the comparative example. In pieces of write data, a hatched write data indicates that the write bit exists, and a non-hatched write data indicates that the write bit does not exist (hereinafter referred to as "blank data"). A hatched bank indicates the bank to which the bias voltage is supplied during the data write. It is assumed that the 16-byte data corresponding to the write unit length is dispersed one by one into the 16 banks included in the memory core.

For the comparative example of FIG. 35, the bias voltage is supplied to all the banks even if the write data is the blank data. At this point, a reverse bias is applied to the non-selected memory cell even in the bank for which the data write is not necessary, which causes the generation of the excessive leakage current.

Figure 13:
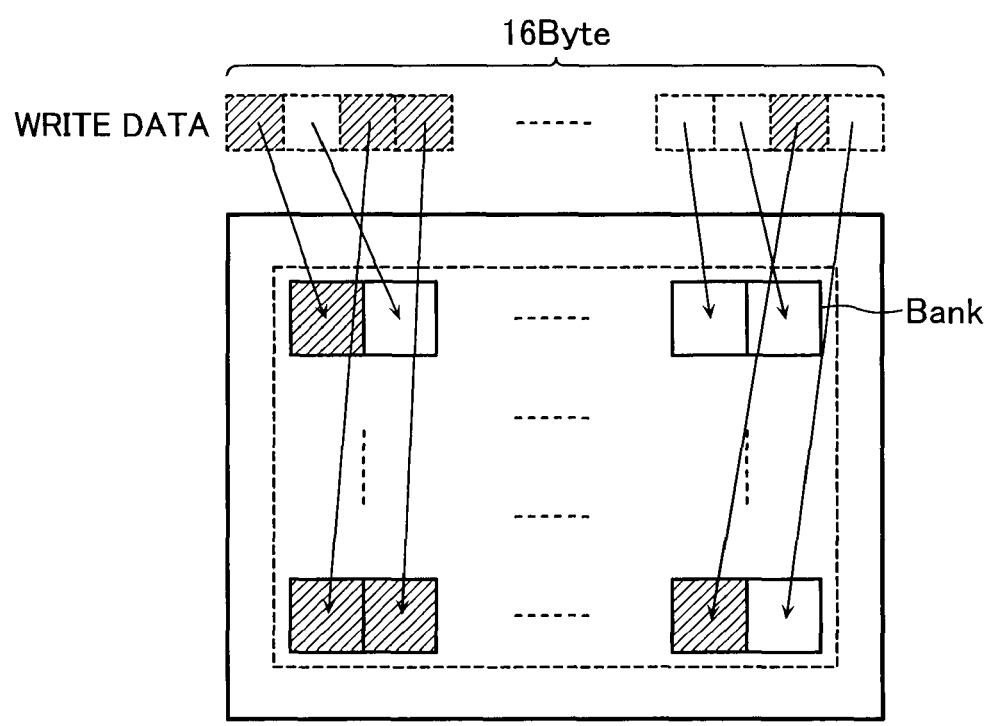
FIG. 13 illustrates a page write operation in a nonvolatile memory according to a second embodiment of the invention.

On the other hand, for the second embodiment of FIG. 13, unlike the comparative example of FIG. 35, the bias voltage is supplied only to the bank in which the write bit exists, and the bias voltage is not supplied to the bank in which the write bit does not exist. In such cases, the leakage current is not generated in the non-selected memory cell for the bank in which the write data is the blank data, so that the power consumption can be reduced compared with the comparative example.

An internal configuration of the nonvolatile memory that realizes the page write operation of FIG. 13 will be described below.

Figure 14:
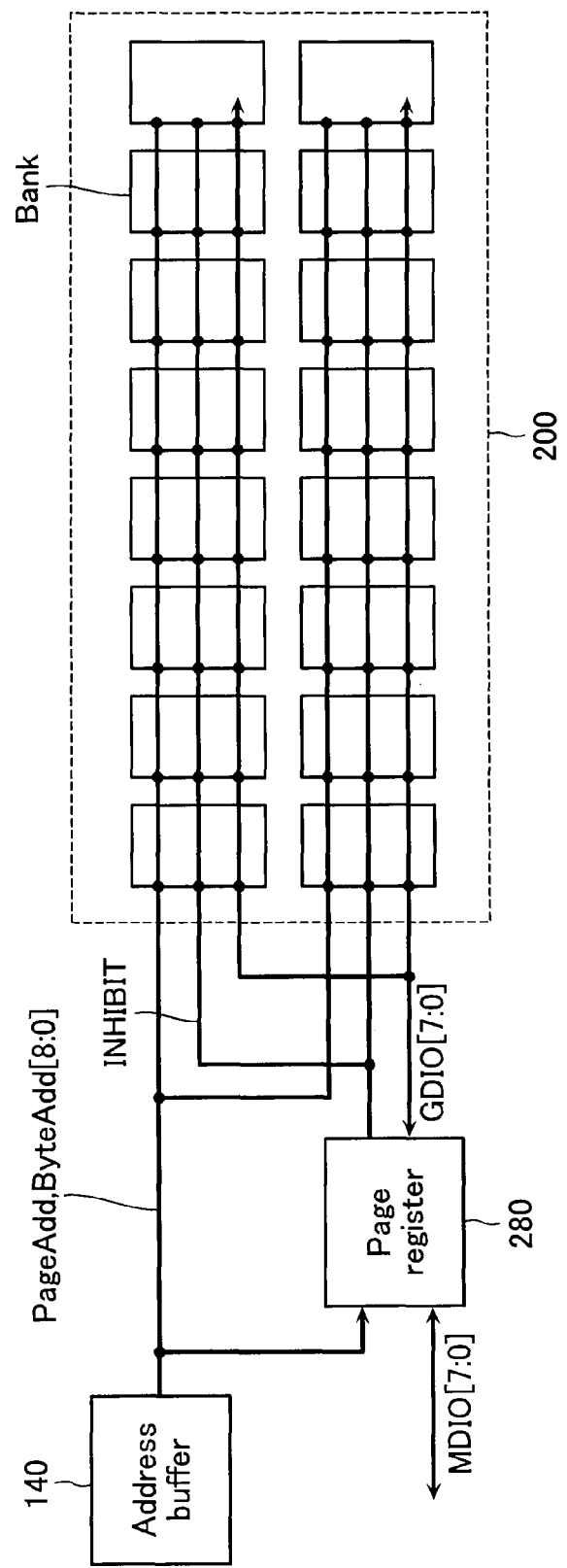
FIG. 14 illustrates a signal connection relationship among an address buffer, a page register, and banks in the nonvolatile memory of the second embodiment.

FIG. 14 illustrates a signal connection relationship among the address buffer 140, a page register 280, and a memory core 200 including plural banks in the second embodiment.

The address buffer 140 commonly transmits the page address PageAdd and the column address ByteAdd[8:0] to the banks of the memory core 200. The page register 280 transmits and receives the data transmitted and received through the internal bidirectional data bus MDIO[7:0] to each bank of the memory core 200 through the common data bus GDIO[7:0]. The page register 280 that is a data inspection circuit transmits a bias voltage inhibition signal INHIBIT to each bank of the memory core 200. The supply of the bias voltage to the corresponding bank is prevented when the bias voltage inhibition signal INHIBIT is activated.

Figure 15:
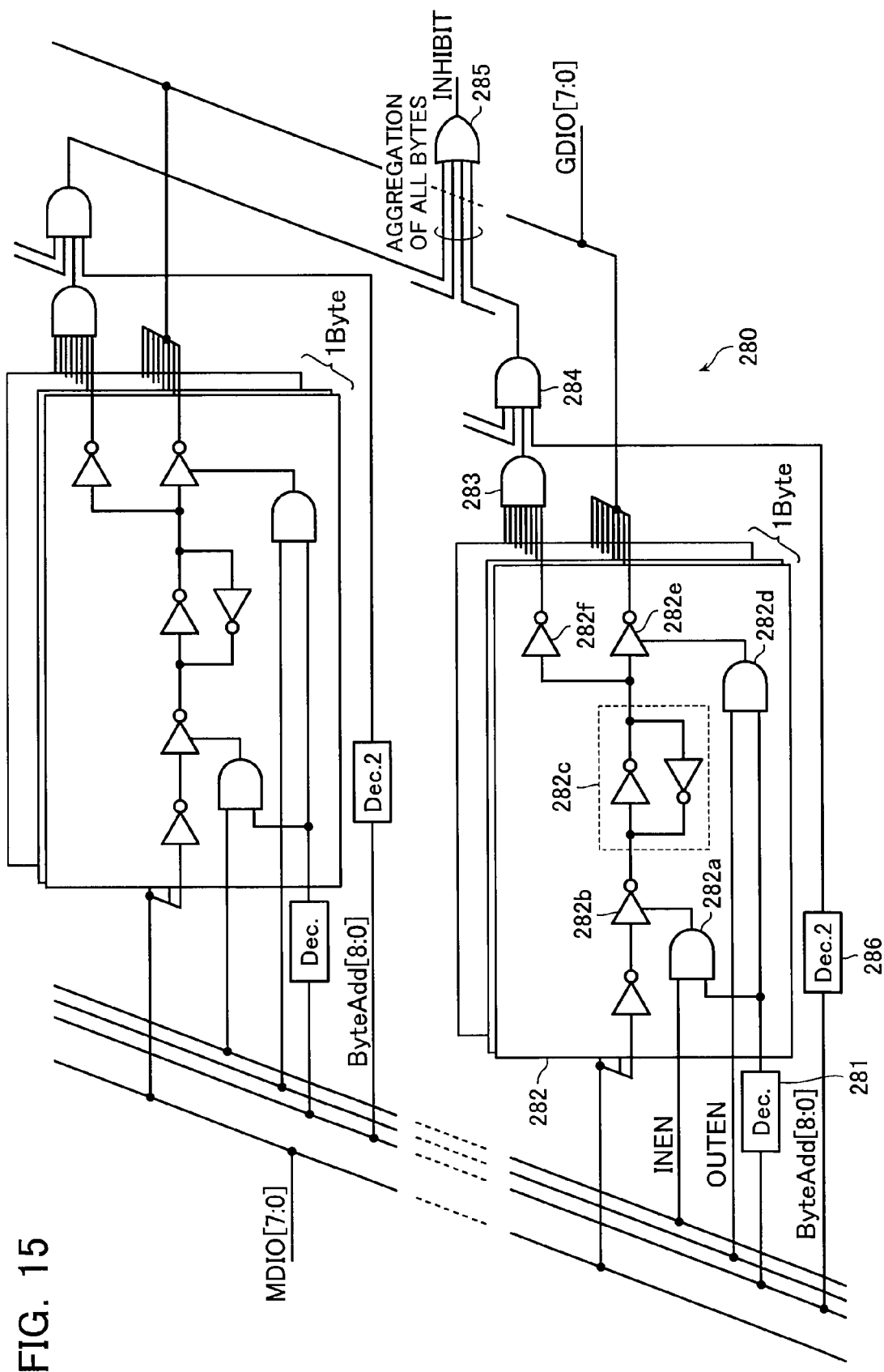
FIG. 15 illustrates an internal configuration example around a page register of the nonvolatile memory of the second embodiment.

FIG. 15 illustrates an internal configuration example of the page register 280 that produces the bias voltage inhibition signal INHIBIT.

The page register 280 includes a bit register 282 every bit. Each bit register 282 includes a flip-flop 282c that retains the data. The bit register 282 also includes a gated inverter 282b and a logical gate 282a. The gated inverter 282b transfers the write data transmitted through the internal bidirectional data bus MDIO[7:0] to the flipflop 282c. The logical gate 282a controls the gated inverter 282b. The gated inverter 282b is activated by the logical gate 282a on the condition that the bit register 282 is selected while the input permission signal INEN is activated. At this point, a decoder 281 into which the column address ByteAdd[8:0] is fed selects the page register 282 in unit of bytes every set of eight page registers 282. The bit register 282 further includes a gated inverter 282e and a logical gate 282d. The gated inverter 282e transfers the write data retained by the flipflop 282c to the common data bus GDIO[7:0]. The logical gate 282d controls the gated inverter 282e. The gated inverter 282e is activated by the logical gate 282d on the condition that the bit register 282 is selected while the output permission signal OUTEN is activated.

The page register 280 also includes a logical gate 283, a logical gate 284, and a logical gate 285. The logical gate 283 aggregates one-byte data in order to produce the bias voltage inhibition signal INHIBIT. The logical gate 284 transfers the aggregation result of the logical gate 283. The logical gate 285 aggregates all the bytes of the aggregation result transferred from the logical gate 284, and the logical gate 285 produces and taps off the bias voltage inhibition signal INHIBIT.

The logical gate 283 is an eight-input AND gate, and each input is connected to the flipflop 282c of each bit register 282 through an inverter 282f.

The output of the logical gate 283 and an output of an address decoder 286 into which the column address ByteAdd [8:0] is fed are fed into the logical gate 284, and the logical gate 284 transfers the output signal of the logical gate 283 to the logical gate 285 on the condition that the corresponding byte is selected by the column address ByteAdd[8:0].

The logical gate 285 is an OR gate into which the output of the logical gate 284 provided every byte is fed, and the logical gate 285 plays a role of aggregating whether the write bit exists in the byte for all the bytes. The output of the logical gate 285 is the bias voltage inhibition signal INHIBIT, and the bias voltage inhibition signal INHIBIT is activated when the byte selected by the column address ByteAdd[8:0] is the blank data.

Figure 16:
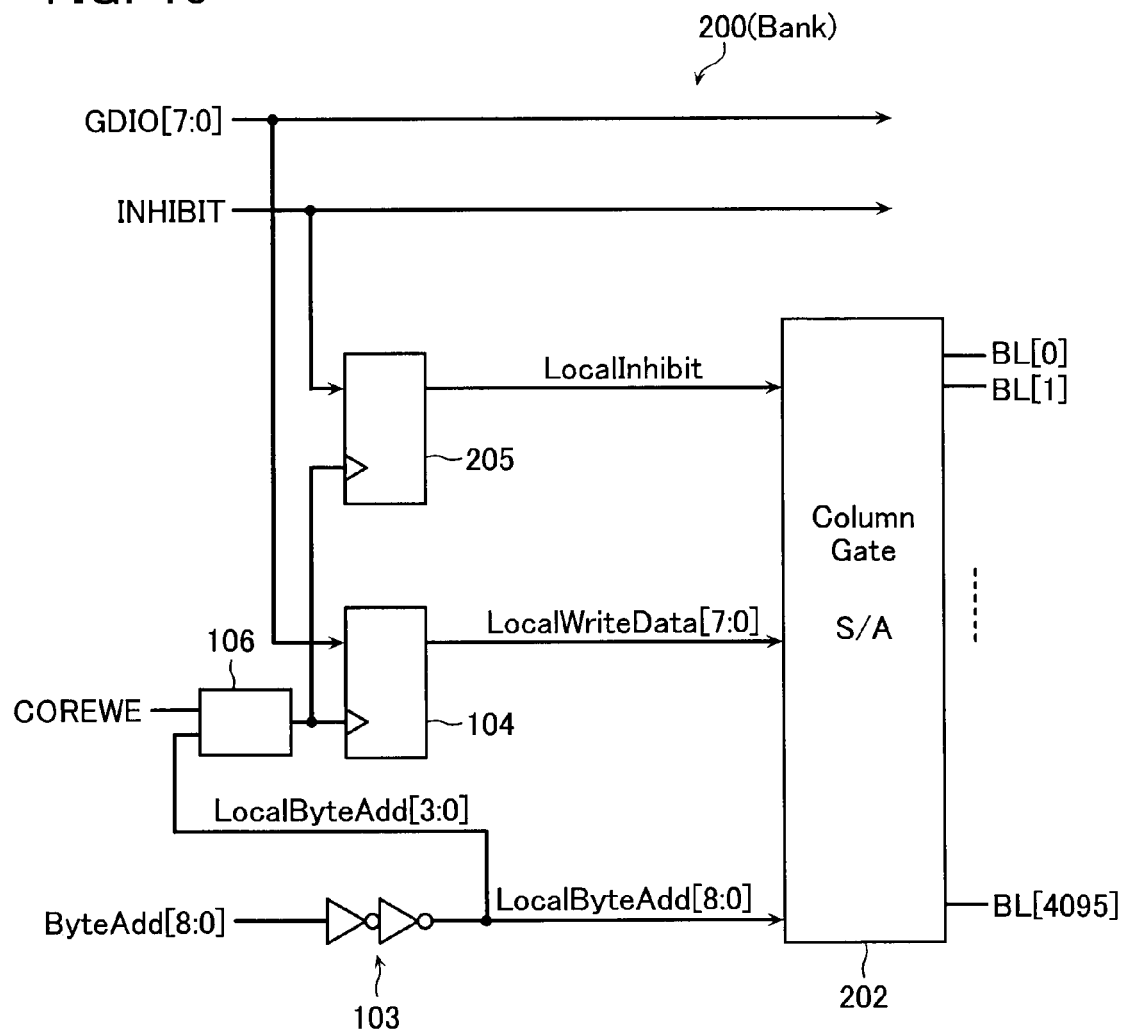
FIG. 16 illustrates an internal configuration example of the bank in the nonvolatile memory of the second embodiment.

FIG. 16 illustrates an internal configuration example of the bank of FIG. 14.

The internal configuration of FIG. 16 includes a local data latch 205 in addition to the internal configuration of the bank of the first embodiment of FIG. 10.

The local data latch 205 receives the bias voltage inhibition signal INHIBIT transmitted from the page register 280. The local data latch 205 activates a local bias voltage inhibition signal LocalInhibit, transmitted to each bank, at the time the bank address decoder 106 makes a notification according to the bias voltage inhibition signal INHIBIT.

The column gate and sense amplifier 202 that receives the local bias voltage inhibition signal LocalInhibit stop the supply of the bias voltage to the bit line BL when the local bias voltage inhibition signal LocalInhibit is activated.

Figure 17:
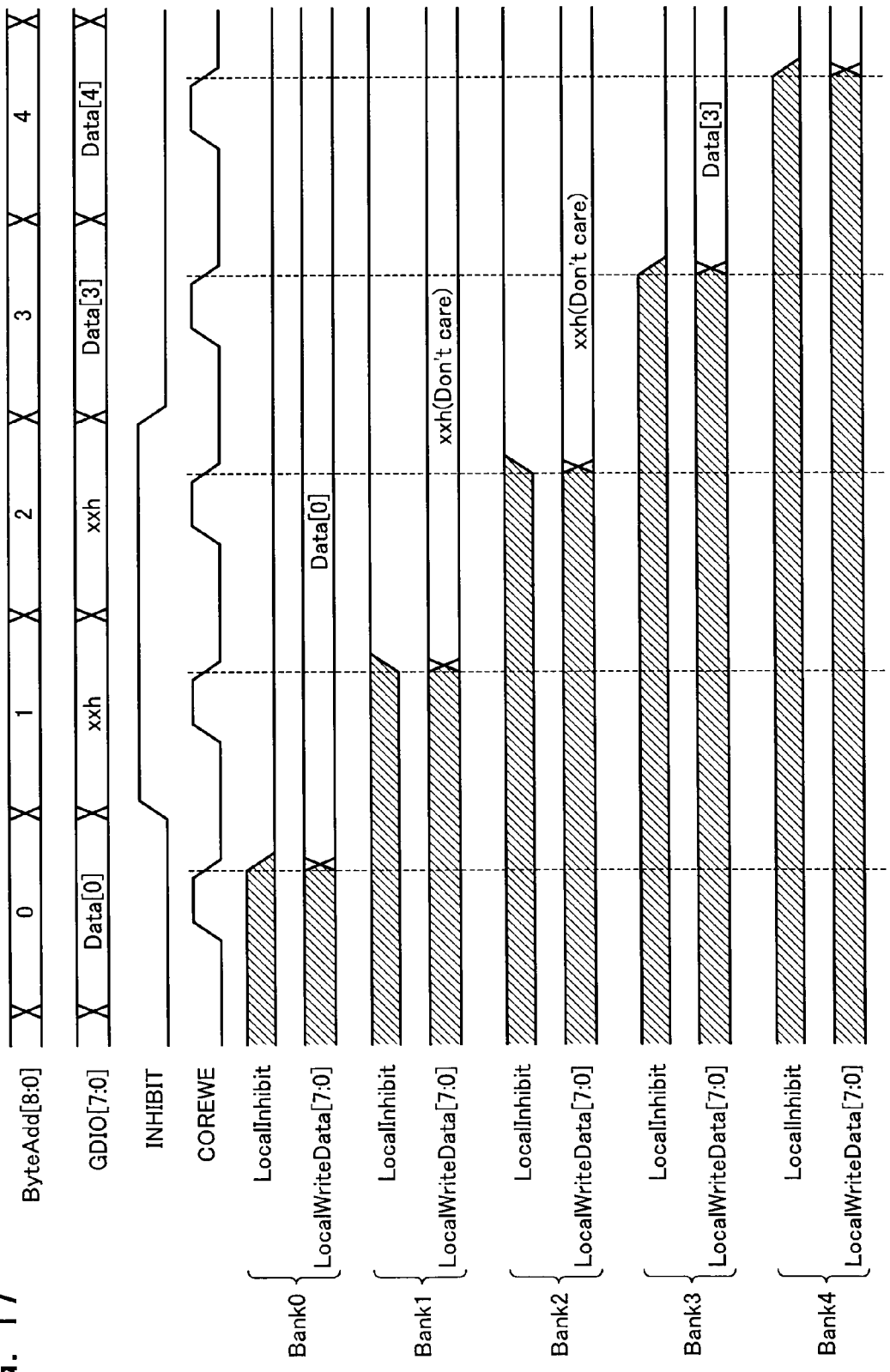
FIG. 17 is a timing chart during the page write operation in the nonvolatile memory of the second embodiment.

FIG. 17 is a timing chart during the page write operation in the nonvolatile memory of the second embodiment. At this point, a hatched portion indicates that the signal is undefined.

Referring to FIG. 17, the write data is supplied to each bank through the common data bus GDIO[7:0] in synchronization with the column address ByteAdd[8:0]. At this point, the page register 280 activates the bias voltage inhibition signal INHIBIT while the blank data is transmitted through the common data bus GDIO[7:0]. In FIG. 17, the column address ByteAdd[8:0]=1 and 2, that is, the period during which the pieces of write data of the banks 1 and 2 are transmitted corresponds to the period during which the page register 280 activates the bias voltage inhibition signal INHIBIT.

In the local data latch 205 of each bank, the bias voltage inhibition signal INHIBIT is latched to activate the local bias voltage inhibition signal LocalInhibit of each bank in falling timing of the write permission signal COREWE. Therefore, the column gate and sense amplifier 202 prevent the supply of the bias voltage to the bit line BL according to the state of the local bias voltage inhibition signal LocalInhibit.

(Page Write Operation by Another Internal Configuration of Bank)

An internal configuration example of a bank of another memory core 250 will be described with reference to FIG. 18. In the internal configuration of FIG. 18, the page write operation of FIG. 13 can also be realized.

Each bank of the memory core 250 includes a logical gate 255 in addition to the internal configuration of the bank of the first embodiment of FIG. 10.

The logical gate 255 is an AND gate into which LocalWriteData[7:0] tapped off from the local data latch 104 is fed. The output of the logical gate 255 is the local bias voltage inhibition signal LocalInhibit, and the local bias voltage inhibition signal LocalInhibit is activated when LocalWriteData[7:0] is the blank data. As with the internal configuration of FIG. 16, the column gate and sense amplifier 202 that receives the local bias voltage inhibition signal LocalInhibit prevent the supply of the bias voltage to the bit line BL according to the state of the local bias voltage inhibition signal LocalInhibit.

Figure 18:
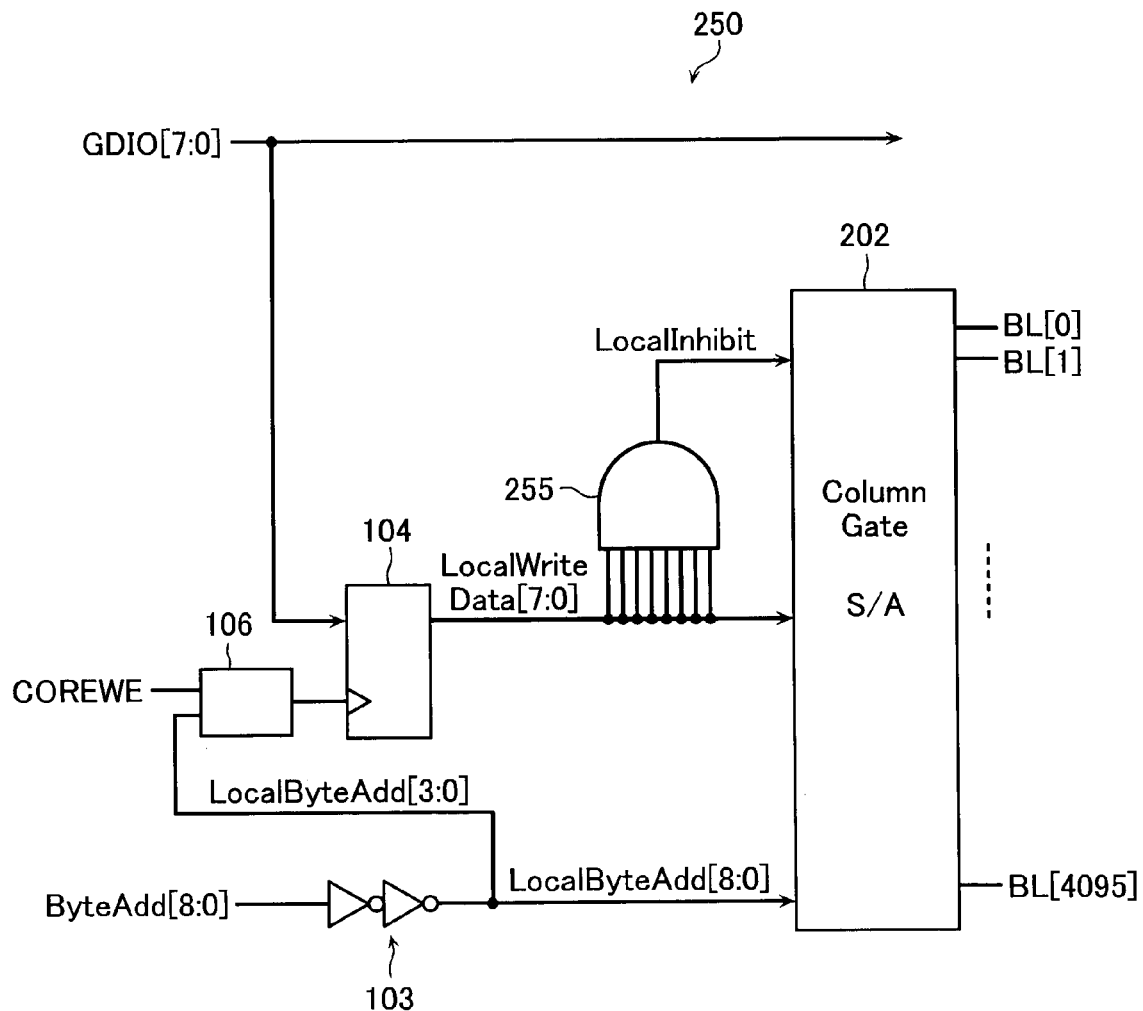
FIG. 18 illustrates another internal configuration example of the bank in the nonvolatile memory of the second embodiment.
Figure 19:
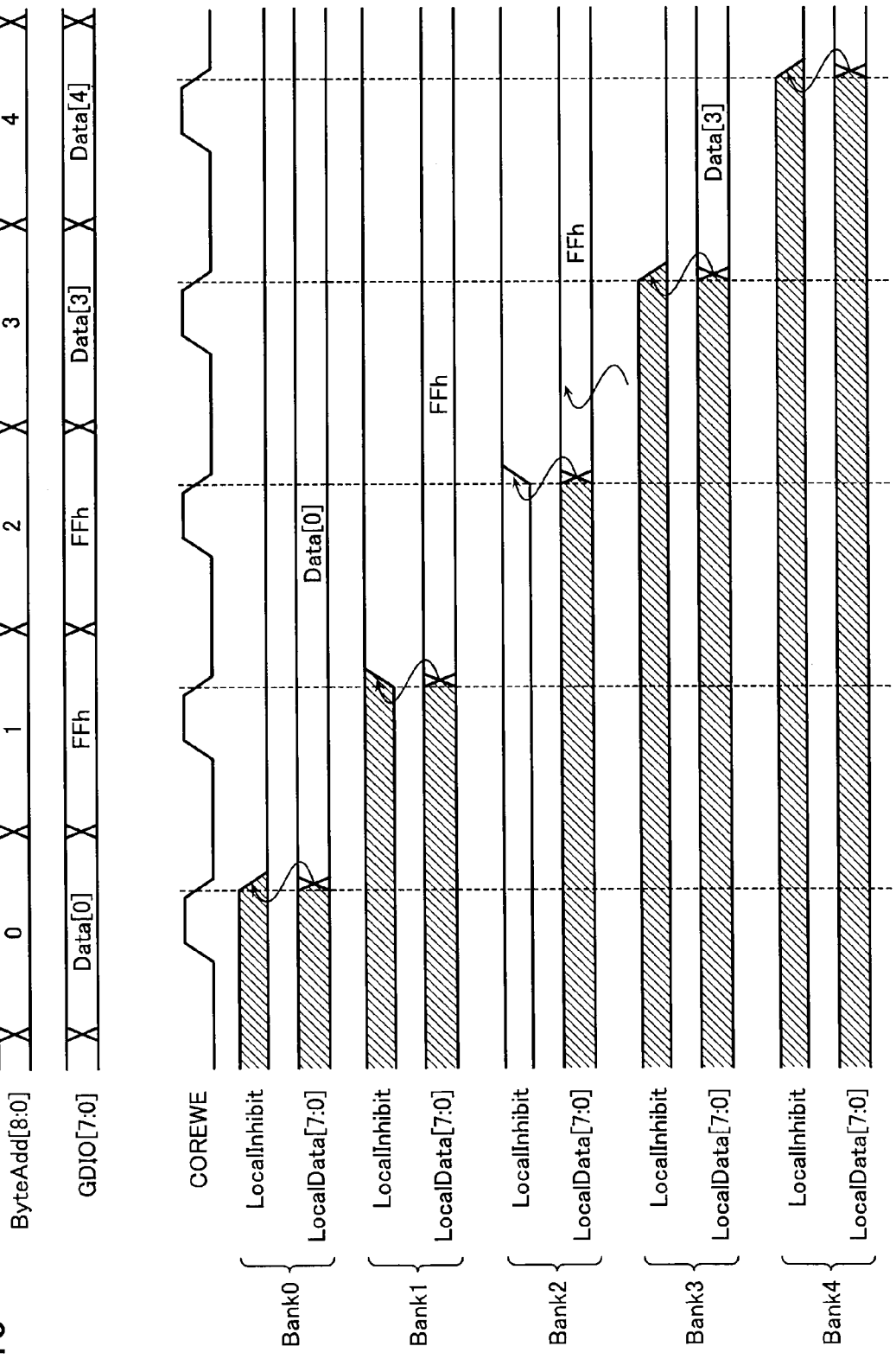
FIG. 19 is another timing chart during the page write operation in the nonvolatile memory of the second embodiment.

FIG. 19 is a timing chart during the page write operation when the internal configuration example of FIG. 18 is used.

For the internal configuration of the bank of FIG. 18, as indicated by an arrow of FIG. 19, the local bias voltage inhibition signal LocalInhibit changes according to the change of the local write data LocalWriteData[7:0] transmitted from the local data latch 104. For example, the local bias voltage inhibition signal LocalInhibit is activated when the local write data LocalWriteData[7:0] in the banks 1 and 2 is FFh, that is, the blank data.

In the internal configuration of FIG. 18, the need for producing the bias voltage inhibition signal INHIBIT is eliminated, so that the internal configuration can be simplified compared with the internal configurations of FIGS. 15 and 16.

Thus, in the second embodiment of FIGS. 14 to 19, the supply of the bias voltage can be prevented for the bank in which the write data is the blank data, so that the current leakage generated in the non-selected memory cell can be reduced. Accordingly, the low-power-consumption nonvolatile memory can be provided.

Third Embodiment

In the second embodiment, the determination whether the write data of each bank is the blank data is made every cycle to control the supply/stop of the bias voltage. However, in the second embodiment, the control becomes complicated. Additionally, for example, when the supply of the bias voltage is resumed in the next cycle after the supply of the bias voltage is stopped in the previous cycle, a waiting time for re-activating the bank is required. As a result, the processing speed of the page write operation is possibly delayed.

Therefore, in a third embodiment, the determination whether the write bit exists in all the cycles is made every bank, and the supply of the bias voltage is stopped in the subsequent cycles at the time the write bit does not exist.

Figure 20A:
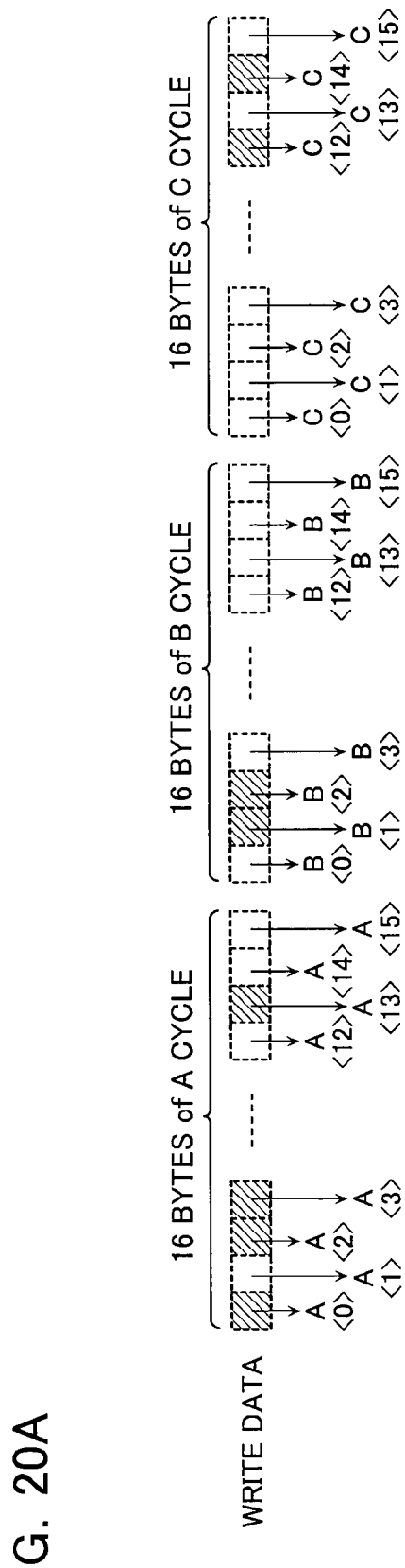
FIG. 20A illustrates a page write operation in a nonvolatile memory according to a third embodiment of the invention.
Figure 20B:
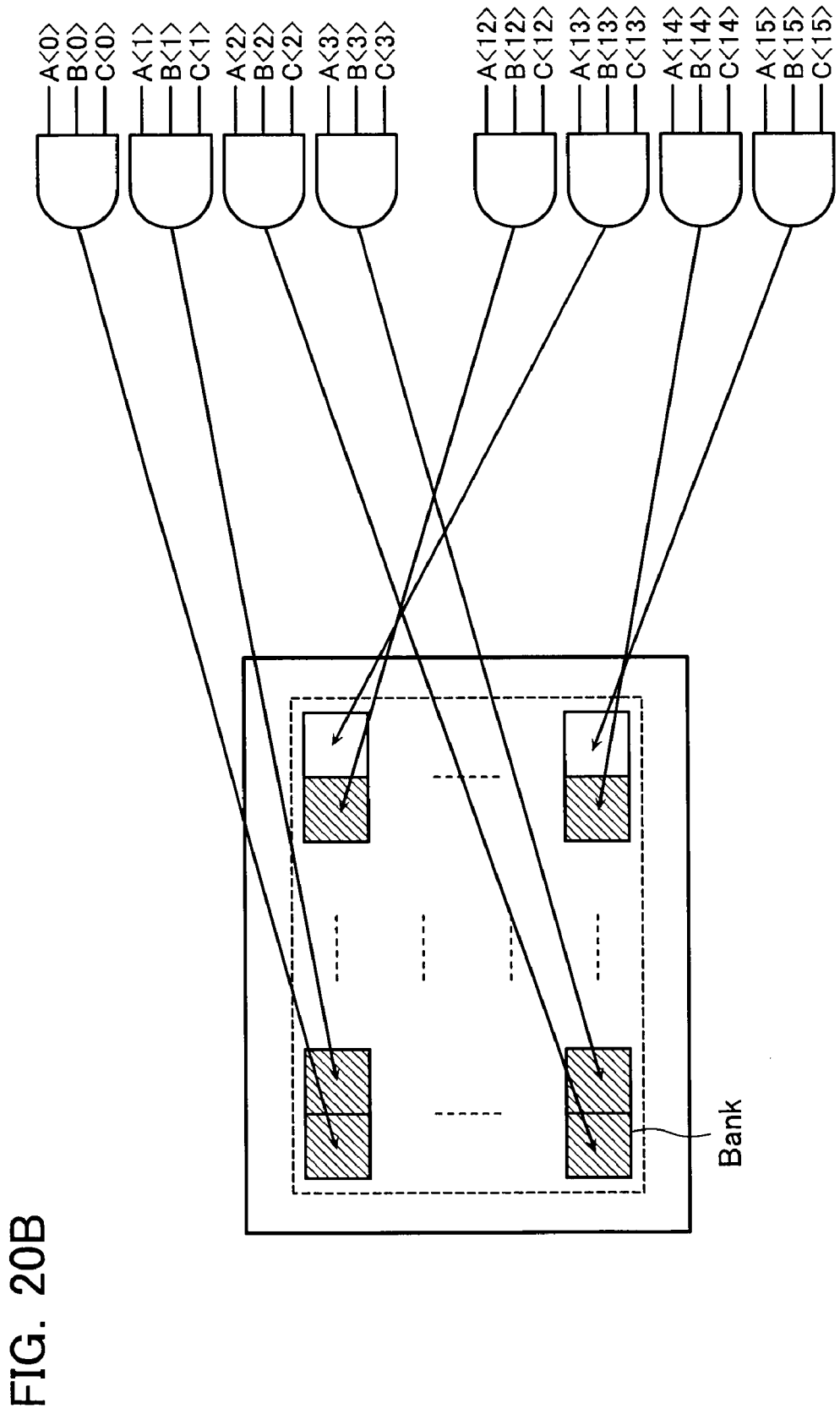
FIG. 20B illustrates the page write operation in the nonvolatile memory of the third embodiment.

FIGS. 20A and 20B illustrate a page write operation of the third embodiment. In FIGS. 20A and 20B, the page write operation is performed in three cycles A to C. In FIG. 20A, a square indicates the write unit, and a hatched square indicates the write unit in which the write bit exists. In FIG. 20B, a hatched bank indicates the bank to which the bias voltage is supplied.

In the third embodiment, assuming that A<i> to C<i> are the pieces of write data in each cycle of a bank i, the bias voltage is supplied until all the pieces of write data A<i> to C<i> become the blank data by operating logical multiplication of the pieces of write data A<i> to C<i> in each cycle.

For example, for the bank 0, because the write data is the blank data except for the write data in the cycle A, the supply of the bias voltage is stopped in the cycles from the cycle B. On the other hand, for the bank 14, because the write data is not the blank data in the cycle C, even if the write data is the blank data, the bias voltage is supplied in the all the cycles until the cycle C is ended.

Figure 21:
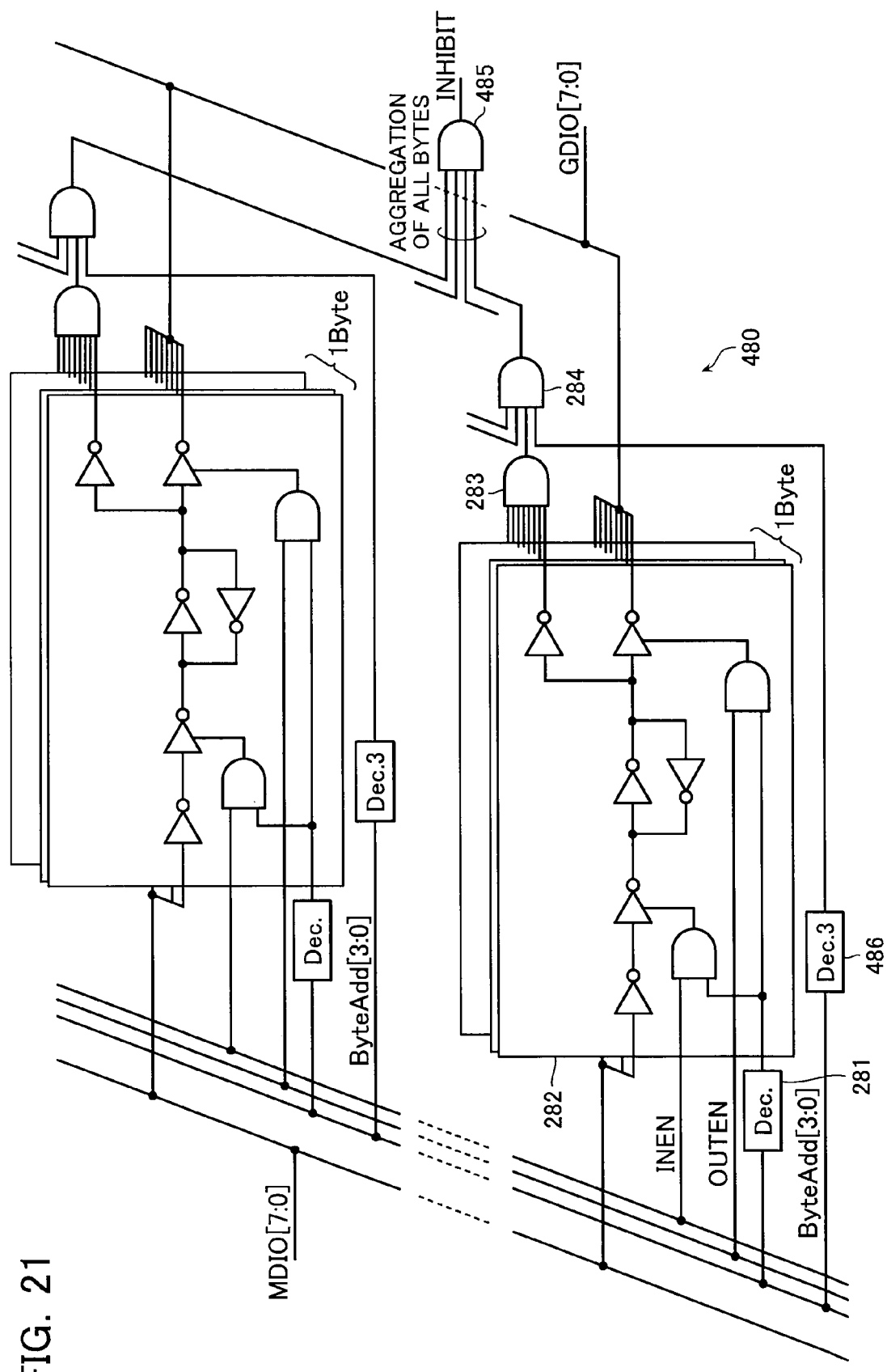
FIG. 21 illustrates an internal configuration example around a page register of the nonvolatile memory of the third embodiment.

FIG. 21 illustrates an internal configuration example of a page register 480 that realizes the page write operation of FIGS. 20A and 20B, and the page register 480 produces the bias voltage inhibition signal INHIBIT that controls the supply/stop of the bias voltage to the bank.

The page register 480 that is a data inspection circuit of the third embodiment has a configuration similar to that of the page register 280 of the second embodiment of FIG. 15 except for an address decoder 486 and a logical gate 485.

Only the column address ByteAdd[3:0] is fed into the address decoder 486 of the third embodiment. Accordingly, all the pieces of write data allocated to the bank specified by the column address ByteAdd[3:0] can be aggregated into the logical gate 485. The logical gate 485 is an AND gate unlike the logical gate 285 of the second embodiment. In such cases, the bias voltage inhibition signal INHIBIT is activated as long as all the bytes become the blank data. As a result, in the pieces of data corresponding to the page length, the bias voltage is supplied as long as the write bit exists in the write data allocated to the bank.

Because other internal configurations except for that of the page register 480 are similar to those of the second embodiment, the description is not repeated here.

In the third embodiment, because the bias voltage is supplied to each bank until the data write is completed, although average power consumption becomes larger than that of the second embodiment, average power consumption per bank can be reduced compared with the comparative example of FIG. 34. It is not necessary to re-activate the bank unlike the second embodiment. Therefore, the control can be simplified, the processing time necessary for the re-activation can be neglected, and the high-speed operation can be realized.

Fourth Embodiment

A page write operation in a nonvolatile memory according to a fourth embodiment of the invention will be described along with a comparative example.

Figure 36:
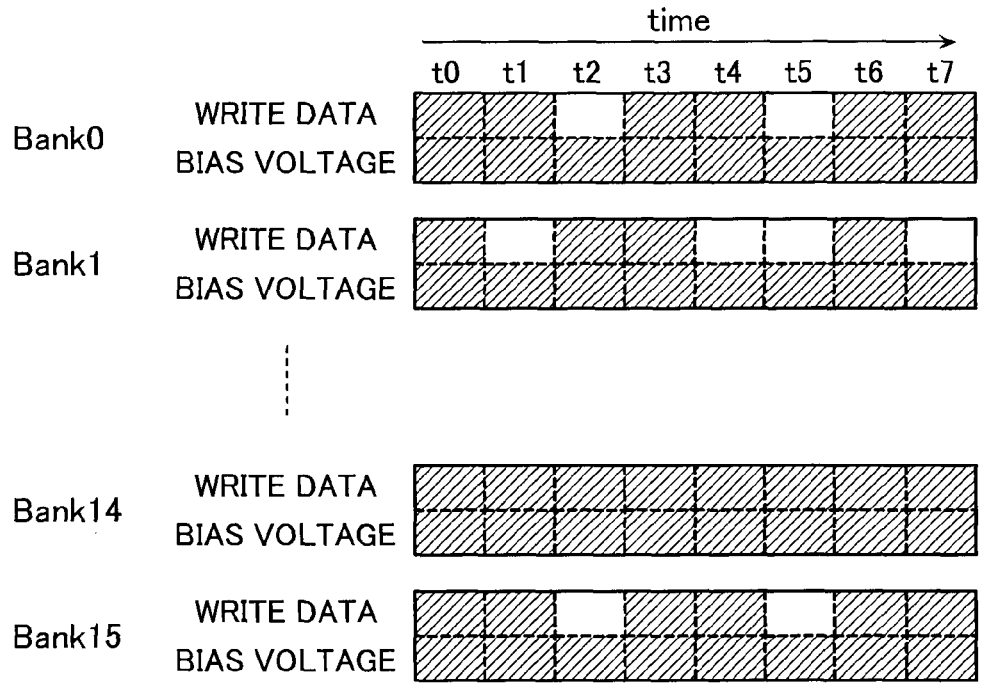
FIG. 36 illustrates a page write operation in a comparative example of the fourth embodiment.

FIG. 36 illustrates the page write operation in the comparative example. FIG. 36 illustrates a relationship among the cycle, write data, and the bias voltage in each bank. An upper stage illustrates the write data, and a hatched portion indicates that the write bit exists. A lower stage illustrates the bias voltage supplied to the bank, and a hatched portion indicates that the bias voltage is supplied.

For the comparative example, even if the write data is the blank data, the bias voltage is supplied to all the banks associated with the selected page. Accordingly, for the bank 0, the bias voltage is supplied at times t2 and t5 even if the write data in the current cycle is the blank data.

Figure 22:
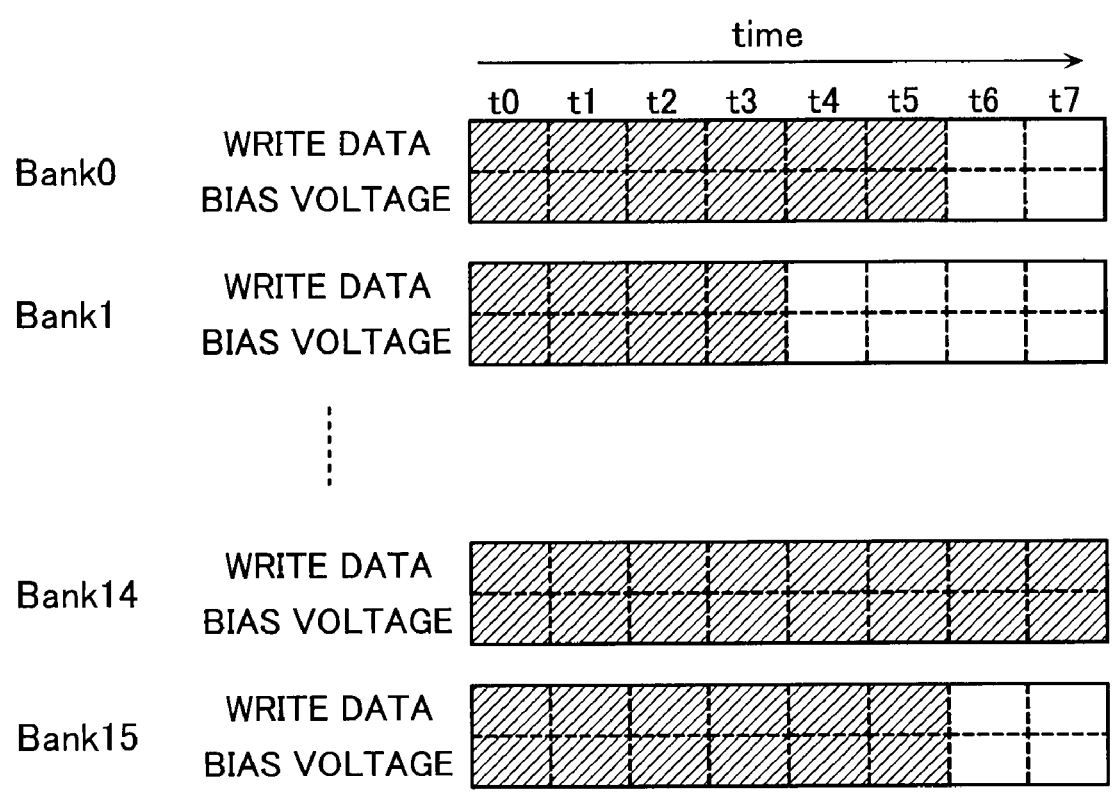
FIG. 22 illustrates a page write operation in a nonvolatile memory according to a fourth embodiment of the invention.

In the fourth embodiment, as illustrated in FIG. 22, the write data in the next cycle is written ahead of schedule when the write data is the blank data. For example, in the bank 0, when the write data is the blank data in two cycles (cycles at the times t2 and t5 in the comparative example) of eight cycles at times t0 to t7, because the page write of the bank 0 is already completed at the end of the cycle at the time t5, the supply of the bias voltage to the bank 0 can be stopped from the time t6. In such cases, although the number of cycles necessary for the page write operation becomes the maximum number in the numbers of cycles necessary for the banks (eight times of bank 14 in FIG. 22), the average power consumption for all the banks can be reduced because the supply of the bias voltage is sequentially stopped for the bank in which the page write operation is completed.

An internal configuration of the nonvolatile memory that realizes the page write operation of FIG. 22 will be described below.

Figure 23:
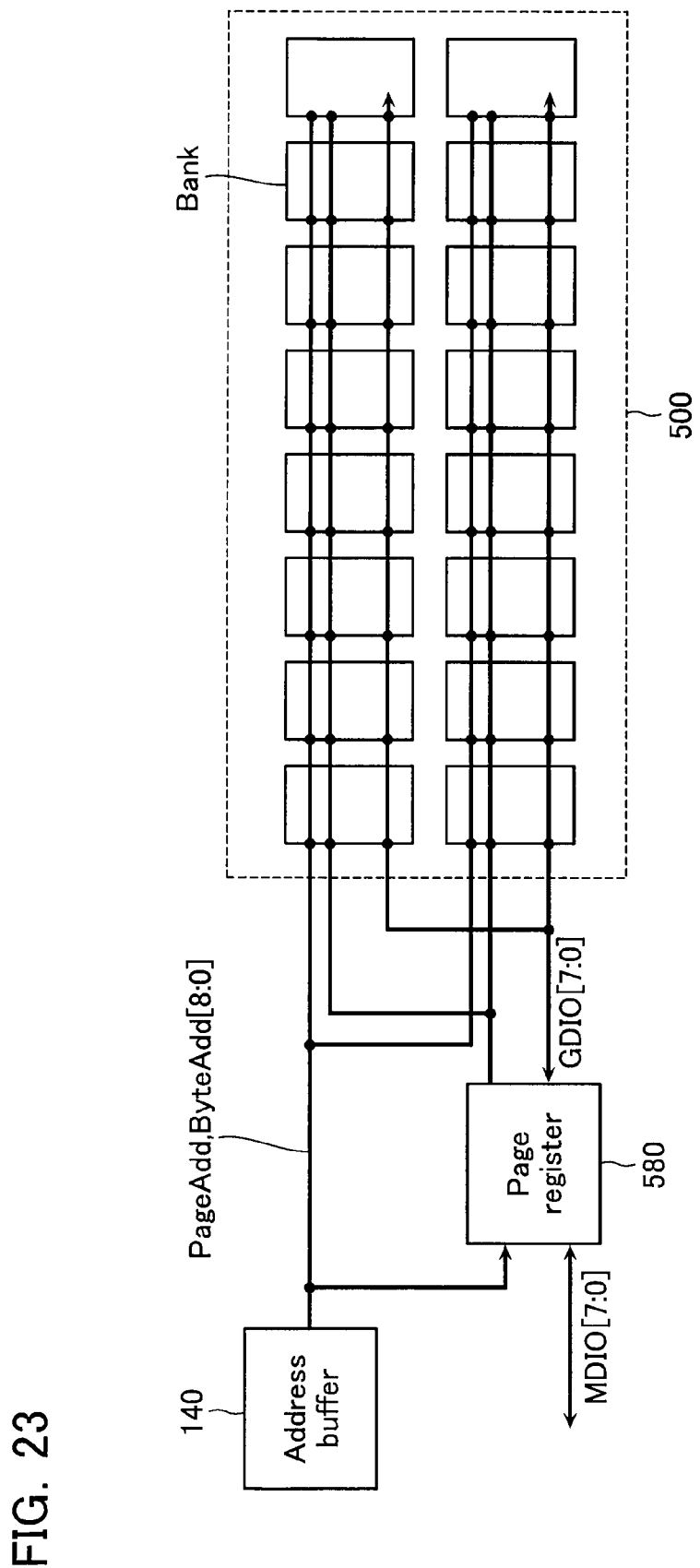
FIG. 23 illustrates a signal connection relationship among an address buffer, a page register, and a bank in the nonvolatile memory of the fourth embodiment.

FIG. 23 illustrates a signal connection relationship among the address buffer 140, a page register 580, and a memory core 500 including plural banks in the fourth embodiment.

The address buffer 140 taps off each signal of the page address PageAdd and the column address ByteAdd[8:0] in one page. The page address PageAdd is commonly transmitted to the banks of the memory core 500. On the other hand, the column address ByteAdd[8:0] is divided into the first address ByteAdd[8:4] that specifies the write unit and the second address ByteAdd[3:0] that specifies the bank, the first address ByteAdd[8:4] is commonly transmitted to the banks of the memory core 500 through the page register 580, and the second address ByteAdd[3:0] is commonly and directly transmitted to the banks of the memory core 500.

The page register 580 performs the data input/output to the input buffer 120 and the output buffer 160 through the internal bidirectional data bus MDIO[7:0] connected onto the input/output pin side. The page register 580 performs the data input/output to each bank through the common data bus GDIO[7:0] connected onto the side of the memory core 500.

Figure 24:
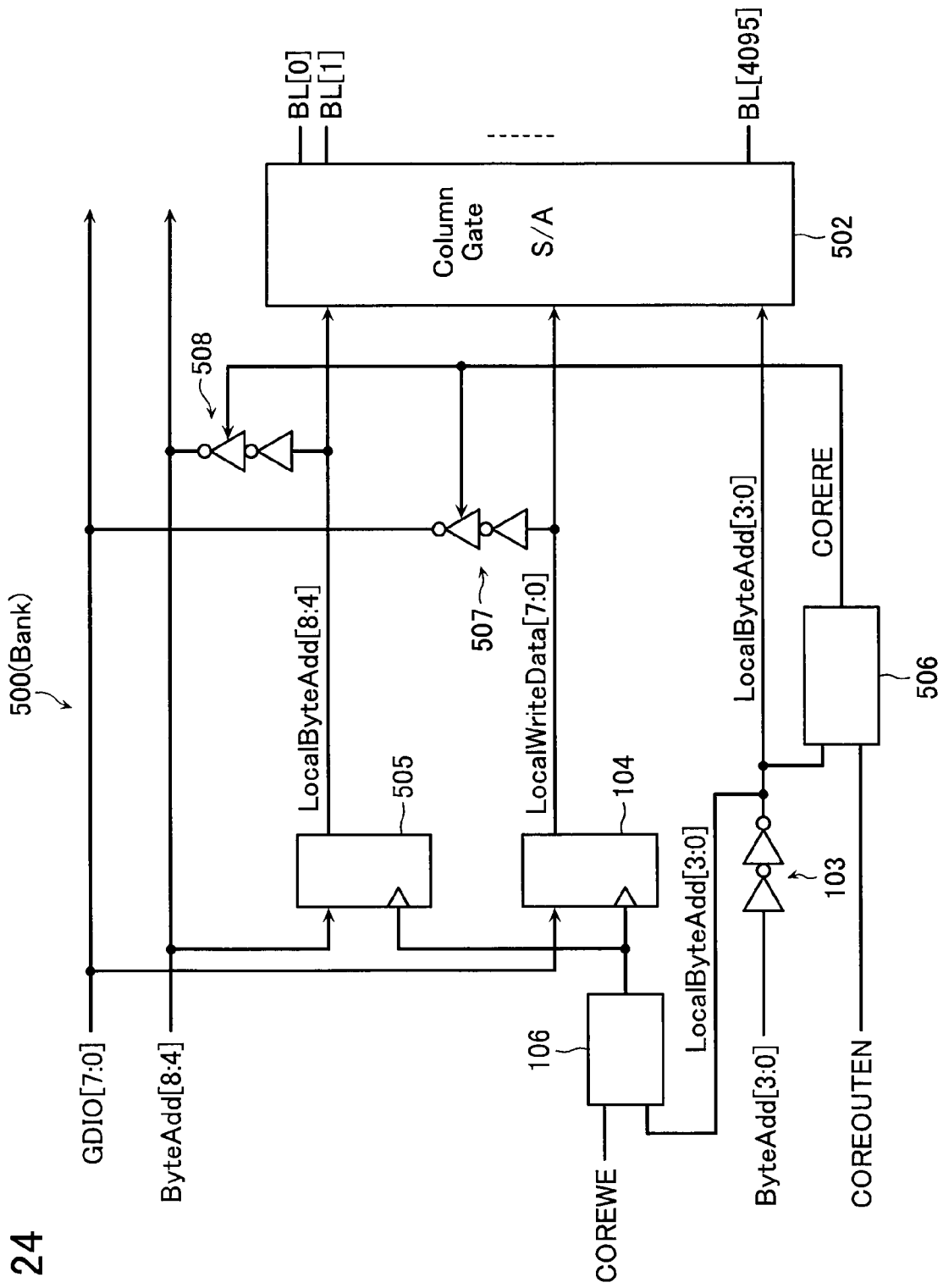
FIG. 24 illustrates an internal configuration example of the bank in the nonvolatile memory of the fourth embodiment.

An internal configuration example of the bank of the memory core 500 will be described with reference to FIG. 24.

The column address ByteAdd[3:0] transmitted from the address buffer 140 is transmitted as the local column address LocalByteAdd[3:0] to a column gate and a sense amplifier 502 through the buffer circuit 103 that is inserted if needed, and the column address ByteAdd[3:0] is also transmitted to the bank address decoder 106.

In addition to the local column address LocalByteAdd[3:0] corresponding to the second address portion, the bank address decoder 106 receives the write permission signal COREWE transmitted from the array controller 190a. The bank address decoder 106 notifies the local data latch 104 and a local address latch 505 of the data latch timing on the condition that the write permission signal COREWE is activated while the column address ByteAdd[3:0] specifies the bank.

After receiving the notification, the local data latch 104 latches the write data existing in the common data bus GDIO [7:0] in the data latch timing, and the local data latch 104 transmits the write data as the local write data LocalWriteData[7:0] to the column gate and the sense amplifier 502.

Similarly, after receiving the notification from the bank address decoder 106, the local address latch 505 latches the first address ByteAdd[8:4] in the data latch timing, and the local address latch 505 transmits the write data as the local column address LocalByteAdd[8:4] to the column gate and the sense amplifier 502.

During the data write operation, the output permission signal COREOUTEN and the read permission signal CORERE in each bank are maintained in the inactivated state. Therefore, the outputs of the bus control circuits 507 and 508 are stopped to avoid the collision between the pieces of data in the common data bus GDIO[7:0] and the column address ByteAdd[8:4].

The column gate and the sense amplifier 502 select a certain bit line BL based on the received local column address LocalByteAdd[8:0] and local write data LocalWriteData[7:0], and the column gate and the sense amplifier 502 drive other bit lines BL at the non-selected bias voltage.

An example of an input waveform provided to the circuit of FIG. 24 will be described with reference to FIG. 25. At this point, a pointer k indicates the first address portion ByteAdd[8:4] of the column address, and a pointer m indicates the second address portion ByteAdd[3:0].

Prior to the page write operation, the fed write data is transmitted from the page register 580 to each bank while the column address ByteAdd[8:4] of each piece of data is transmitted.

The pieces of data retained by the page register 580 are transmitted to the banks in the order from k=0 and m=0. In FIG. 24, the write data of the address 0 is directly transmitted.

When the write data of k=0 and m=1 is transmitted, a blank data signal BlankData that is an internal signal of the page register 580 is activated because the write data is the blank data. When the blank data signal BlankData is activated, it is not necessary to modify the data of the memory cell that is the write target. When the write bit exists in the write data of k=1 and m=1 to be written in the next cycle, because the write data of k=1 and m=1 can be written along with the write data of k=0 and m=0, the processing time necessary for the page write operation can be shortened, and the leakage current caused by the non-selected memory cell during the data write can also be reduced.

Figure 25:
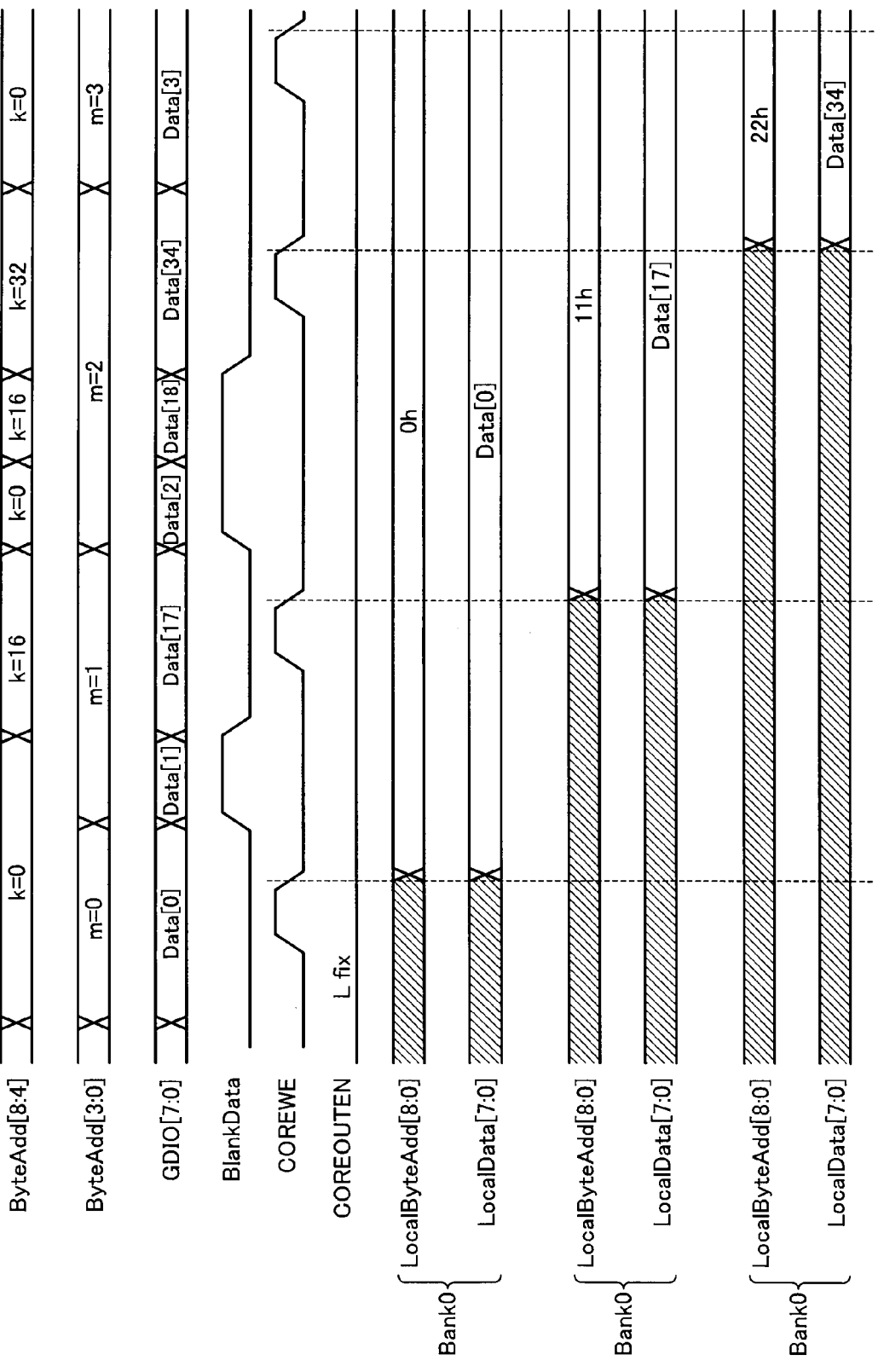
FIG. 25 is a timing chart during the page write operation in the nonvolatile memory of the fourth embodiment.

Specifically, as illustrated in FIG. 25, when the activation of the blank data signal BlankData is detected in transmitting write data Data[1] of k=0 and m=1, the write data Data[1] is not directly transmitted to the bank, but write data Data[17] to be written in the next cycle is transmitted. The column address ByteAdd[8:4] that indicates the write data of the next cycle is also transmitted. After the blank data signal BlankData is detected, a value of the pointer k is incremented by 16 (corresponding to the write unit length) to inspect the write data of the next cycle, and the write data is transmitted when the write data is not the blank data.

Then, after the value of the pointer k is returned to the pre-increment value, the pointer m is incremented to transmit the data of the next column address ByteAdd[8:0].

For m=2, because pieces of data Data[2] and Data[18] of k=0 and 16 are the blank data, write data Data[34] corresponding to the address of m=2 and k=32 is transmitted after the point k is incremented to 32.

Similarly the write data is continuously transmitted to other banks.

Figure 26:
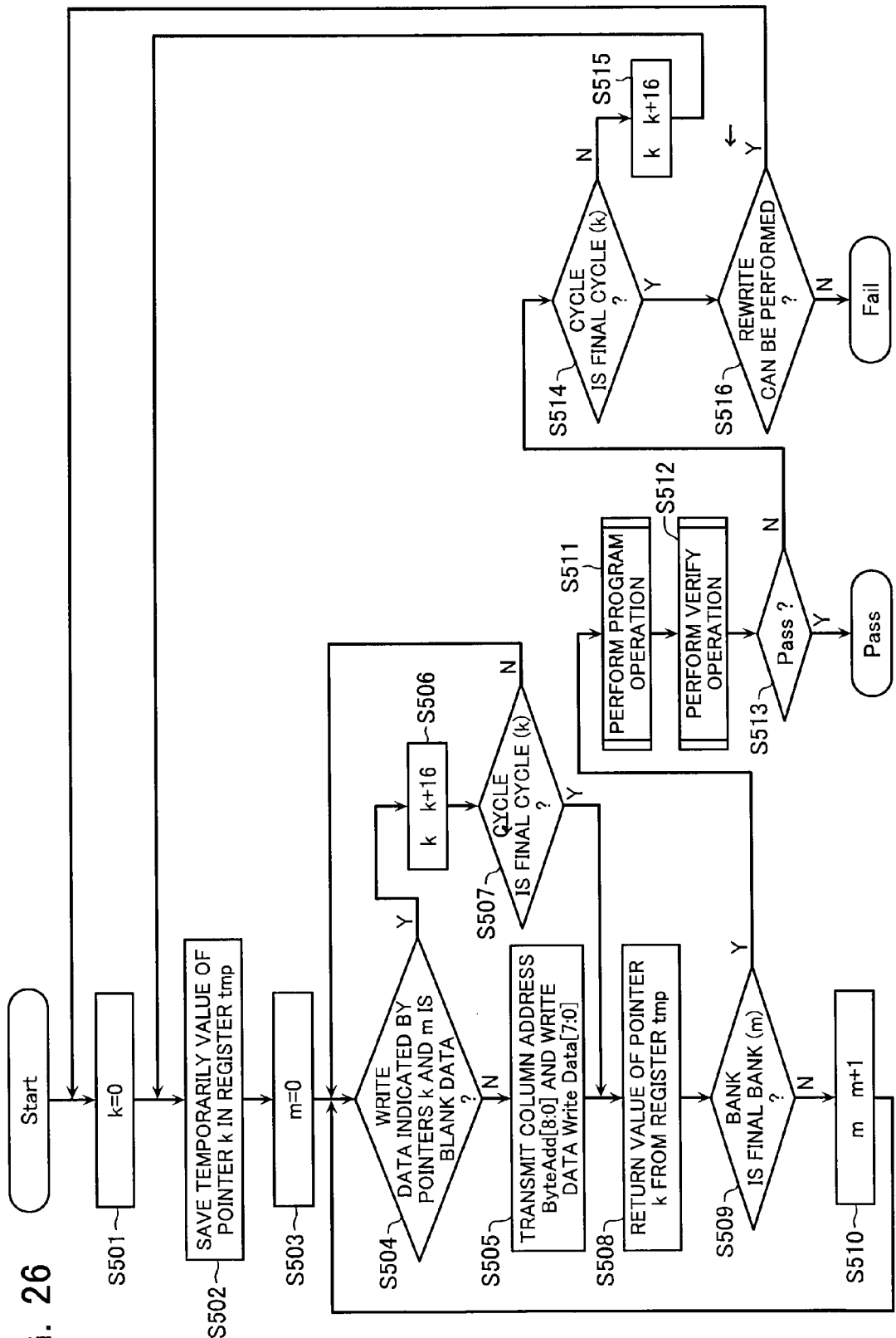
FIG. 26 is a flowchart of the page write operation in the nonvolatile memory of the fourth embodiment.

A page write operation of the fourth embodiment will be described with reference to FIG. 26. The page write operation of FIG. 26 is mainly controlled by the sequence controller 170, the page register 580, the array controller 190a, and the page register controller 190b.

In S501, the pointer k is initialized. Actually the column address ByteAdd[8:4] is initialized.

In S502, the value of the pointer k is saved in a temporary storage register tmp (not illustrated) that is separately provided. The value of the pointer k is retained until the transmission of the write data and the column address is ended.

In S503, the pointer m is initialized. Specifically, the column address ByteAdd[3:0] is initialized. Therefore the transfer of the write data is started from the bank 0.

In S504, a determination whether the write data of the address specified by the two pointers k and m is the blank data is made. Specifically the determination is made based on whether the blank data signal BlankData is activated. As a result, the flow goes to S505 (described later) when the write bit exists, and the flow goes to S506 when the write data is the blank data.

In S505, the column address ByteAdd[8:0] specified by the pointers k and m and the write data corresponding to the column address ByteAdd[8:0] are transmitted. Specifically, the column address ByteAdd[8:0] and the corresponding write data are retained by the local address latch 505 and local data latch 104 that are disposed in each bank with the write permission signal COREWE as a trigger.

In S506, the pointer k is incremented by 16 in order to prepare the write data inspection in the next cycle. The increment of the pointer k is permitted within a range where the value of the pointer k does not exceed the address in the page. Therefore, in S507, a determination whether the value of the pointer k does not exceed the address in the page is made. When the value of the pointer k equals or smaller than the address in the page, the flow goes to S504 in order to inspect the write data corresponding to the address specified by the pointers k and m. On the other hand, when the value of the pointer k exceeds the address in the page, that is, when the data write is completed for the target bank, the flow goes to S508 in order to prepare the write data for other banks that are already transmitted.

In S508, in order to transmit the write data to the next bank, the value of the pointer k saved in S502 is returned from the temporary storage register tmp.

In S509, a determination whether the bank is the final bank is made in order to determine whether the transmission of the write data to other banks is continued. When the bank to which the write data is not transferred yet exists, the flow goes to S504 in order to specify the address of the next bank after the pointer m is incremented in S510. On the other hand, for the final bank (m=15), because the transmission of the write data is completed for all the banks, the flow goes to the program operation in S511 and the verify operation in S512.

At this point, the program operation in S511 and the verify operation in S512 are performed by the well-known operation procedures.

In S513, a determination whether the write data passes the verification is made, and the page write operation is completed when the write data passes the verification. On the other hand, when the write data does not pass the verification, the flow goes to S514 in order to determine whether the additional write is performed.

When the pointer k does not reach the final pointer k, the flow goes to S515 in order to perform the write associated with the next pointer k, and the flow goes to S502 after the pointer k is incremented. On the other hand, when the pointer k reaches the final pointer k, the flow goes to S516. In S516, a determination whether the pointer k is initialized to perform the re-write is made. Specifically, although not illustrated, the determination is made based on whether the time or the number of write stress times reaches a certain value. Actually, the determination in S516 corresponds to the case in which the memory cell in which the data cannot be written even in the final pointer k exists or the case in which the number of write defect bits exceeds the permissible number. When the rewrite is determined to be performed, the flow goes to S501 to initialize the pointer k, and the flow is performed again. On the other hand the rewrite is determined not to be performed, the data write is determined to fail, and the page write operation is ended (Fail).

In the above description, for the sake of convenience, the processing is divided into the pieces of processing. However, when the pieces of processing can concurrently be performed on the circuit operation, the pieces of processing may be performed at the same time. The order of the pieces of processing may slightly be changed as long as any trouble is not generated on the circuit operation.

A data transfer operation from each bank to the page register 180 in the verify operation will be described with reference to FIGS. 27 and 28.

Figure 27:
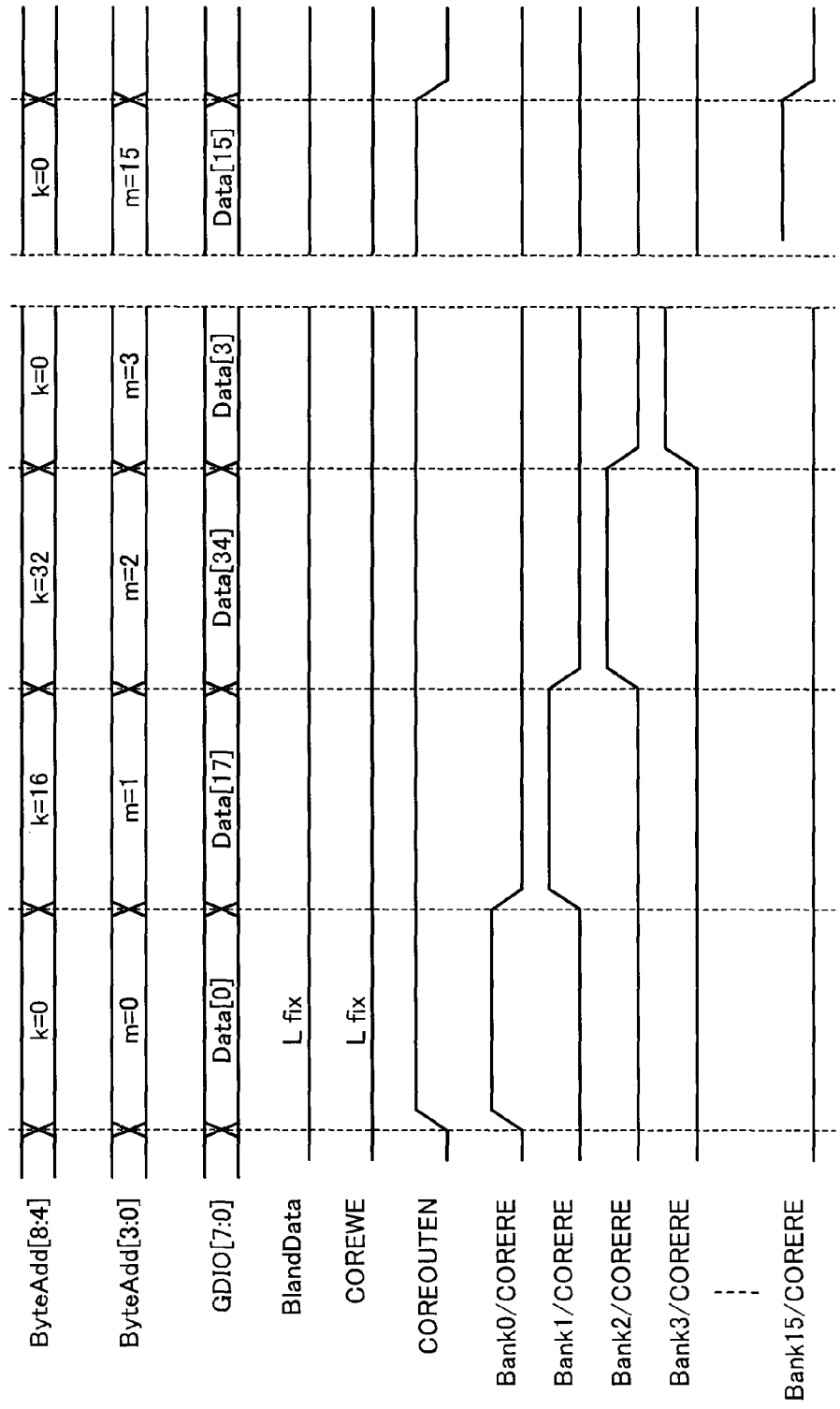
FIG. 27 is a timing chart during a verify operation in the nonvolatile memory of the fourth embodiment.
Figure 28:
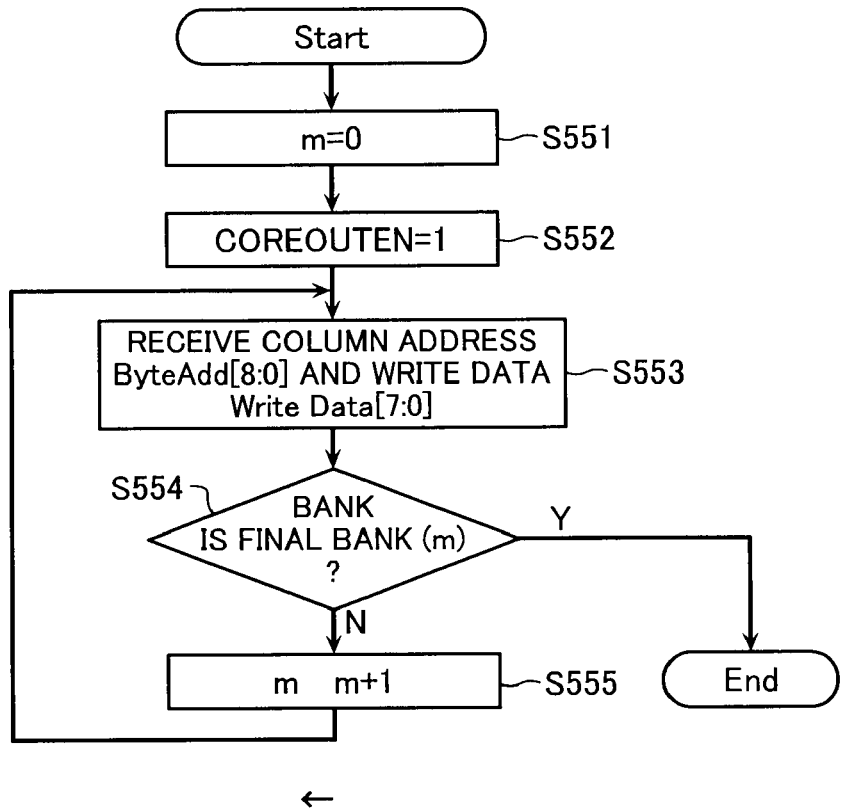
FIG. 28 is a flowchart for realizing the operation of FIG. 27.

FIG. 27 is a timing chart in the verify operation, and FIG. 28 illustrates a flowchart of the verify operation performed to the transmitted read data.

The bus control circuits 507 and 508 are activated by the output permission signal COREOUTEN, and the outputs of the input buffer 120 and address buffer 140 are stopped in order to avoid the collision between the pieces of data in the common data bus GDIO[7:0]. The column address ByteAdd [8:4] is tapped off from the bank specified by the column address ByteAdd[3:0], and the verify data is tapped off to the common data bus GDIO[7:0]. At this point, the data of the common data bus GDIO[7:0] is stored in a certain position specified by the column address ByteAdd[8:0] of the page register 180, and the data of the common data bus GDIO[7:0] is used as the verify result and the next write data.

In FIG. 28, the operation waveform of FIG. 27 is illustrated as a flowchart.

In S551, the pointer m is initialed. Specifically, the column address ByteAdd[3:0] is initialized.

In S552, the output permission signal COREOUTEN is activated to permit the output of the verify data from each bank and the output of the column address ByteAdd[8:4] possessed by each bank.

In S553, the output data in S552 is taken in the certain register. At this point, the operation in S553 includes the operation for storing the data in the certain column address ByteAdd[8:0] of the page register 180.

In S554, a determination whether the verify data transfer is completed for all the banks is made, and a string of transmission operation is ended when the verify data transfer is completed for all the banks (End). On the other hand, when the verify data transfer is not completed for all the banks, the flow goes to S553 after the pointer m is incremented in S555. As used herein, specifically the increment of the pointer m means the counter increment of the column address ByteAdd[3:0].

Thus, in the fourth embodiment, when the write data in the current cycle is the blank data, the write data in the next cycle is written ahead of schedule. Therefore, the page write operation can be shortened, and therefore the power consumption can be reduced.

Fifth Embodiment

Figure 29:
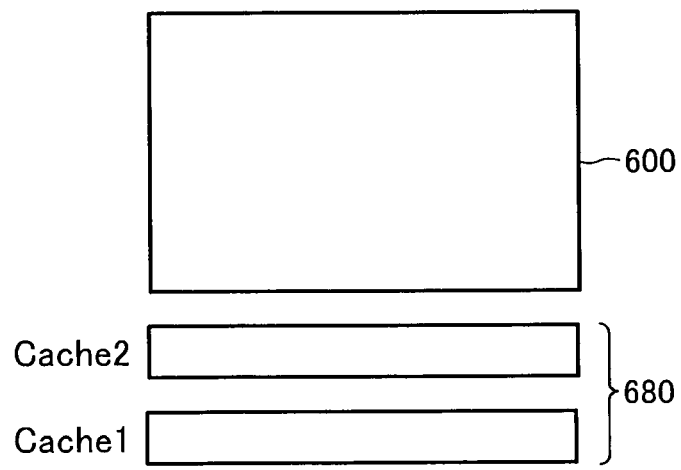
FIG. 29 illustrates a logical configuration of a page register of a nonvolatile memory according to a fifth embodiment of the invention.

FIG. 29 conceptually illustrates a memory core 600 and a page register 680 of a nonvolatile memory according to a fifth embodiment of the invention.

In the fifth embodiment, the page register 680 includes a first cache 1 and a second cache 2. The first cache 1 and the second cache 2 differ from each other, and the first cache 1 and the second cache 2 have at least one byte. Three or more caches may be provided.

When the data is written in the nonvolatile memory, certain write data is stored in a certain address of the cache 2 of the page register 680.

After the page write operation is started, mirroring of the data of the cache 1 is performed to the cache 2, and the data of the cache 2 is used in the data write. The verify data may be stored in the cache 2 after the data write, or the write data may be retained by the cache 2 until the data write is completed.

In most nonvolatile memories, when the page write operation is performed, the data corresponding to the page length is tentatively retained by the cache 2, and then the data write is started. Accordingly, when a plurality of data, each length is less than the page length, are intermittently-arrived, it is necessary to start the data write after the final write data arrives.

In the fifth embodiment, the problem is solved to achieve the speed enhancement of the page write operation.

Figure 30:
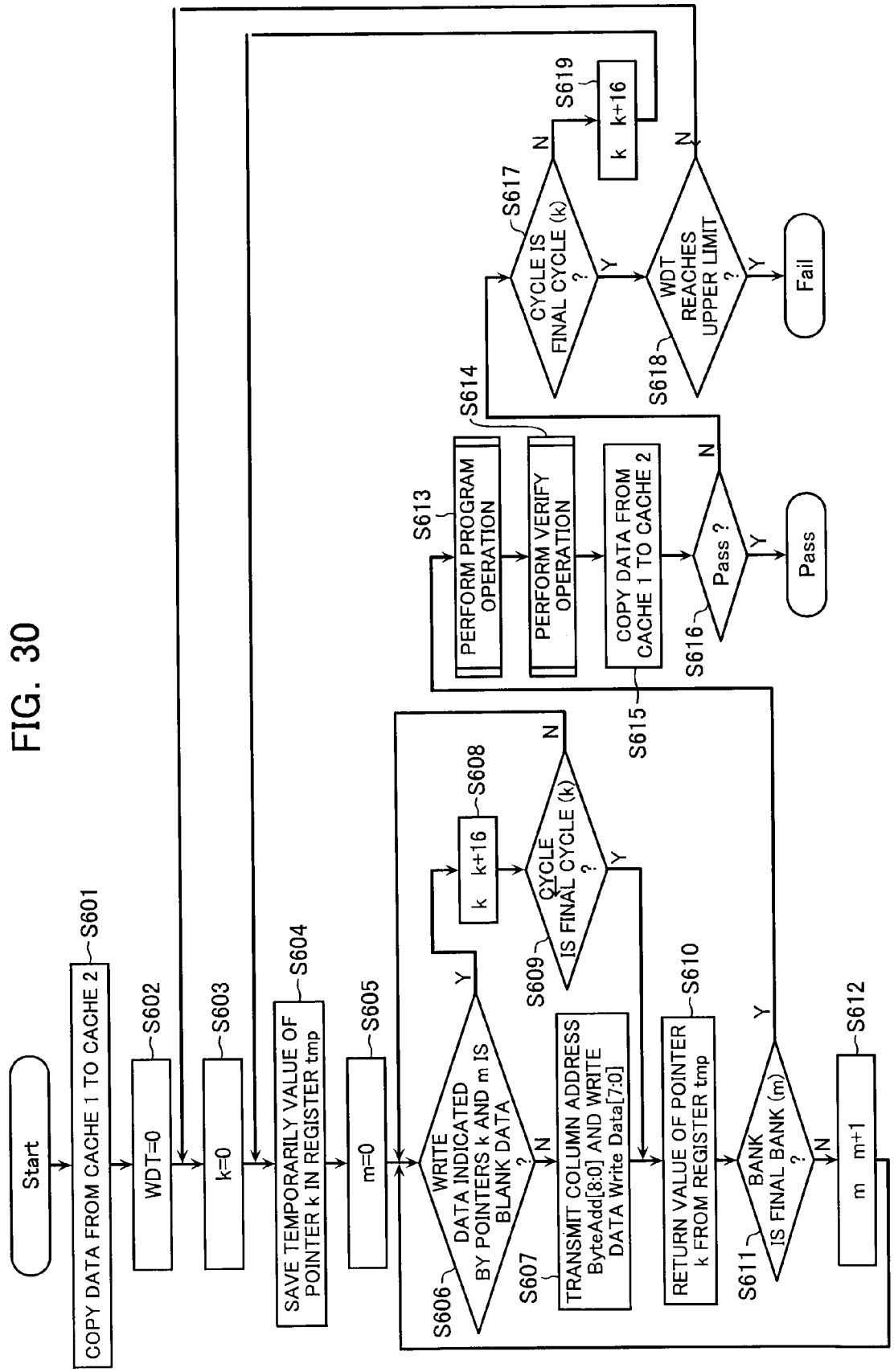
FIG. 30 is a flowchart of a page write operation in the nonvolatile memory of the fifth embodiment.

FIG. 30 is a flowchart of a page write operation of the fifth embodiment.

In S601, the write data retained by the cache 1 is copied into the cache 2.

Then a watchdog timer (hereinafter referred to as "WDT") is initialized. Because the page write operation is performed by the plural cycles, WDT is required when the data write in which a predetermined time elapses is dealt with as a write defect. In such cases, WDT is operated at a background of the page write operation, and a string of operations is forcedly ended when the write operation is not completed even after the predetermined time elapses. Instead of WDT, the string of operations may be ended by the number of write pulse applying times or means computed from the time and voltage.

Because S603 to S614 are similar to S501 to S512 of FIG. 25, the description is not repeated here.

After the program operation in S613 and the verify operation in S614, overwrite is performed to the data retained by the cache 2 that is already used in the data write in S615 when the write data is added to the cache 1. Alternatively, a logical operation of the data retained by the cache 1 and the data retained by the cache 2 may be performed to determine whether the write data is added.

In S616, a determination whether the page write operation is completed is made. When the page write operation is completed, the page write operation is ended. On the other hand, when the page write operation is not completed to require the additional page write operation, the flow goes to S617.

In S617, when the pointer k does not reach the end of the page, after the pointer k is incremented in S619, the flow returns to S604 in order to perform the page write operation again. When the additional write operation is required in the final pointer k, that is, when the additional write data inspected in S615 exists, the pointer k is initialized if needed, and the flow returns to S603. However, in consideration of the stress applied by the data write, it is proper that data write is dealt with as the write defect when it is detected that WDT performed on the background reaches a predetermined upper limit. The determination is made in S618.

Figure 37:
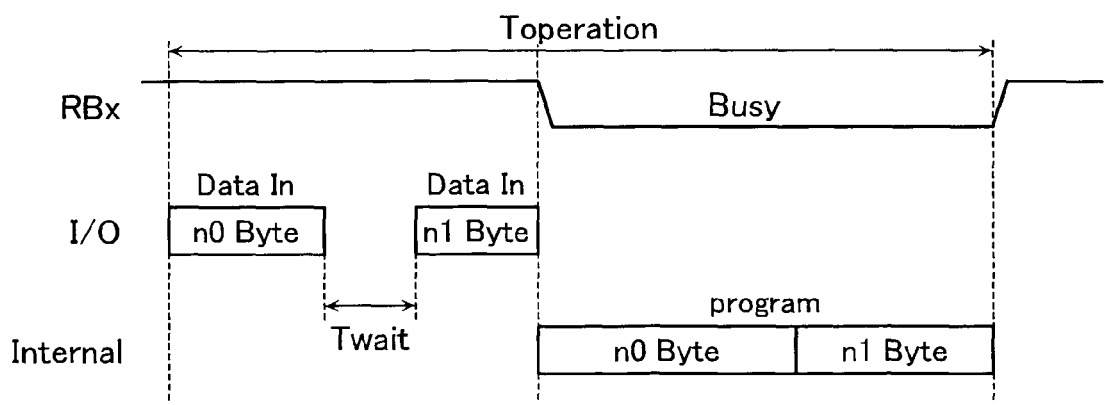
FIG. 37 illustrates task scheduling in a comparative example of the fifth embodiment.

The above-described operation will be described from the viewpoint of task scheduling with reference to a comparative example of FIGS. 31 and 37.

Figure 31:
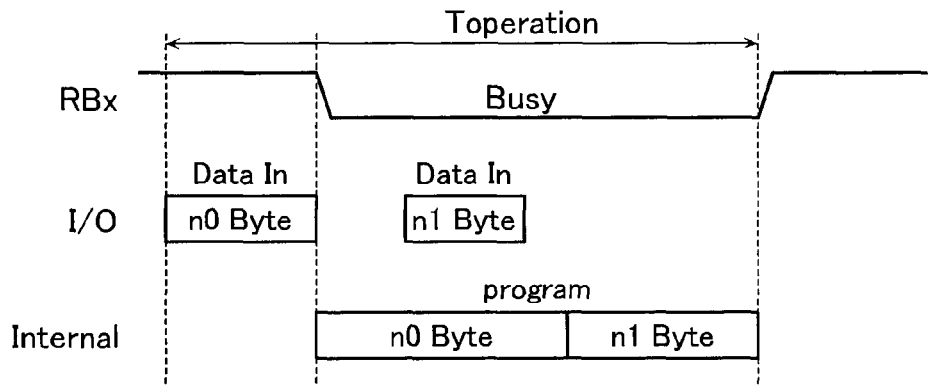
FIG. 31 illustrates task scheduling in the nonvolatile memory of the fifth embodiment.

FIG. 31 illustrates task scheduling of the page write operation of the fifth embodiment. In the data corresponding to page length (512 bytes), the data write is started after the first data group n0 byte (n0<<512) arrives. A data group n1 byte having another column address belonging to the same page can be retained by the cache 1 in parallel with the data write of the data group n0 byte. At this point, when the data group n1 arrives, the data write of the data group n1 byte can continuously be performed after the data write of the data group n0 byte.

On the other hand, for the comparative example of FIG. 36 to which the fifth embodiment is not applied, because the data write operation is started after the data group n1 byte arrives, the processing time for the page write operation increases. Further, unfortunately the convenience is lowered because a bus that connects the nonvolatile memory and a host controlling the nonvolatile memory is occupied in a period Twait during which the nonvolatile memory waits for the arrival of all of page data.

On the other hand, in the fifth embodiment, the data write operation and the operation for waiting for the next data are concurrently performed. Therefore, the processing time of the page write operation can be shortened, and therefore the resultant power consumption can be reduced. Because the time the bus is occupied by the communication between the host and the nonvolatile memory of the fifth embodiment can be shortened, the user-friendly nonvolatile memory can be provided.

(Others)

Although the embodiments of the invention are described above, the invention is not limited to the embodiments. The various modifications can be made without departing from the scope of the invention.

What is claimed is:

1. A nonvolatile semiconductor storage device comprising:
a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks;
a control circuit that controls the data write circuit to perform page write in each write unit including a predetermined number of memory cells, pieces of data being written in the page in the page write, the control circuit performing the page write by repeating a step including a program operation and a verify operation, and the control circuit performing the program operation and the verify operation in a next step only to the write unit in which the data write is not completed in the verify operation; and a write data inspection circuit that inspects write data for the bank and determines whether the data write to the bank is not required, wherein the control circuit, in a case that the data write is not required in the write unit in the bank, executes data write in another write unit belonging to the same bank.

2. The nonvolatile semiconductor storage device according to claim 1, wherein the program operation and the verify operation are alternately performed every write unit.

3. The nonvolatile semiconductor storage device according to claim 1, wherein the page write is ended when the number of steps exceeds a predetermined number.

4. The nonvolatile semiconductor storage device according to claim 1, wherein the control circuit produces a column address, the column address including a first address that specifies the write unit and a second address that specifies the bank, and the data write circuit selects the memory cell that becomes a data write target based on the column address.

5. The nonvolatile semiconductor storage device according to claim 1, wherein the control circuit includes a page register, the page register includes a first cache that retains input write data and a second cache that retains a copy of the data of the first cache to transfer the copy to the memory core, and when a write process for writing a certain write unit data belonging a certain page to the memory core is performed during the page write, a next write unit data to be written belonging the certain page is stored in the second cache via the first cache.

6. The nonvolatile semiconductor storage device according to claim 5, wherein the control circuit has a watchdog timer function, and the control circuit ends the page write when a certain time elapses since the page write is started.

7. A nonvolatile semiconductor storage device comprising:
a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks, the data write circuit of the certain bank not supplying the bias voltage when a bias prevention signal is activated, the bias prevention signal preventing the supply of the bias voltage for a data write circuit belonging to the bank in which the data write is not required;

a control circuit that controls the data write circuit to perform page write in each write unit including a predetermined number of memory cells, pieces of data being written in the page in the page write, the control circuit performing the page write by repeating a step including a program operation and a verify operation; and a write data inspection circuit that inspects write data to activate the bias prevention signal, wherein the write data inspection circuit inspects write data for the bank and determines whether the data write to the bank is not required, and the control circuit, in a case that the data write is not required in the write unit in the bank, executes data write in another write unit belonging to the same bank.

8. The nonvolatile semiconductor storage device according to claim 7, wherein the program operation and the verify operation are alternately performed every write unit.

9. The nonvolatile semiconductor storage device according to claim 7, wherein the page write is aborted when the number of steps exceeds a predetermined number.

10. The nonvolatile semiconductor storage device according to claim 7, wherein the control circuit produces a column address, the column address including a first address that specifies the write unit and a second address that specifies the bank, and the data write circuit selects the memory cell that becomes a data write target based on the column address.

11. The nonvolatile semiconductor storage device according to claim 7, wherein the control circuit includes a page register, the page register includes a first cache that retains input write data and a second cache that retains a copy of the data of the first cache to transfer the copy to the memory core, and when a write process for writing a certain write unit data belonging a certain page to the memory core is performed during the page write, a next write unit data to be written belonging the certain page is stored in the second cache via the first cache.

12. The nonvolatile semiconductor storage device according to claim 11, wherein the control circuit has a watchdog timer function, and the control circuit ends the page write when a predetermined time elapses since the page write is started.

13. A nonvolatile semiconductor storage device comprising:
a memory core that includes a plurality of banks, the bank including a plurality of memory cells that are provided into a matrix shape and a data write circuit that supplies a bias voltage necessary to write data to the memory cell, the memory core being logically divided into a plurality of pages, the page including a predetermined number of memory cells belonging to a predetermined number of banks, the data write circuit of the certain bank not supplying the bias voltage when a bias prevention signal is activated, the bias prevention signal preventing the supply of the bias voltage for a data write circuit belonging to the bank in which the data write is not required;

a control circuit that controls the data write circuit to perform page write in each write unit including a predetermined number of memory cells, pieces of data being written in the page in the page write, the control circuit performing the page write by repeating a step including a program operation and a verify operation; and a write data inspection circuit that inspects write data, the write data belonging to the different write units and the same bank, the write data inspection circuit activating the bias prevention signal when the write data is the data in which the data write is not required wherein the write data inspection circuit inspects write data for the bank and determines whether the data write to the bank is not required, and the control circuit, in a case that the data write is not required in the write unit in the bank, executes data write in another write unit belonging to the same bank.

14. The nonvolatile semiconductor storage device according to claim 13, wherein the program operation and the verify operation are alternately performed every write unit.

15. The nonvolatile semiconductor storage device according to claim 13, wherein the page write is aborted when the number of steps exceeds a predetermined number.

16. The nonvolatile semiconductor storage device according to claim 13, wherein the control circuit produces a column address, the column address including a first address that specifies the write unit and a second address that specifies the bank, and the data write circuit selects the memory cell that becomes a data write target based on the column address.

17. The nonvolatile semiconductor storage device according to claim 13, wherein the control circuit includes a page register, the page register includes a first cache that retains input write data and a second cache that retains a copy of the data of the first cache to transfer the copy to the memory core, and when a write process for writing a certain write unit data belonging a certain page to the memory core is performed during the page write, a next write unit data to be written belonging the certain page is stored in the second cache via the first cache.

18. The nonvolatile semiconductor storage device according to claim 1, the bank further including a plurality of first lines, a plurality of second lines intersecting the plurality of first lines, wherein the plurality of memory cells each is provided in each intersection portion of the plurality of first lines and the plurality of second lines, and the data write circuit supplies the bias voltage to the plurality of memory cells via the plurality of first lines and the plurality of second lines.

19. The nonvolatile semiconductor storage device according to claim 7, the bank further including a plurality of first lines, a plurality of second lines intersecting the plurality of first lines, wherein the plurality of memory cells each is provided in each intersection portion of the plurality of first lines and the plurality of second lines, and the data write circuit supplies the bias voltage to the plurality of memory cells via the plurality of first lines and the plurality of second lines.

20. The nonvolatile semiconductor storage device according to claim 13, the bank further including a plurality of first lines, a plurality of second lines intersecting the plurality of first lines, wherein the plurality of memory cells each is provided in each intersection portion of the plurality of first lines and the plurality of second lines, and the data write circuit supplies the bias voltage to the plurality of memory cells via the plurality of first lines and the plurality of second lines.

* * * * *